(12) United States Patent
Dias et al.

(10) Patent No.: US 12,426,516 B2
(45) Date of Patent: Sep. 23, 2025

(54) SUPERCONDUCTING HYDRIDE MATERIALS AND METHODS OF MAKING AND IDENTIFYING SAME

(71) Applicants: University of Rochester, Rochester, NY (US); THE BOARD OF REGENTS OF THE NEVADA SYSTEM OF HIGHER EDUCATION ON BEHALF OF THE UNIVERSITY OF NEVADA, Las Vegas, NV (US)

(72) Inventors: Liyanagamage R. Dias, Rochester, NY (US); Ashkan Salamat, Las Vegas, NV (US)

(73) Assignees: University of Rochester, Rochester, NY (US); The Board of Regents of the Nevada System of Higher Education on Behalf of the University of Nevada, Las Vegas, NV (US)

( * ) Notice: Subject to any disclaimer, the term of this patent is extended or adjusted under 35 U.S.C. 154(b) by 0 days.

(21) Appl. No.: 18/017,075

(22) PCT Filed: Jul. 20, 2021

(86) PCT No.: PCT/US2021/042447
§ 371 (c)(1),
(2) Date: Jan. 19, 2023

(87) PCT Pub. No.: WO2022/020399
PCT Pub. Date: Jan. 27, 2022

(65) Prior Publication Data
US 2023/0301203 A1    Sep. 21, 2023

Related U.S. Application Data

(60) Provisional application No. 63/054,105, filed on Jul. 20, 2020, provisional application No. 63/054,111, filed on Jul. 20, 2020.

(51) Int. Cl.
*H10N 60/85* (2023.01)
*H10N 60/01* (2023.01)

(52) U.S. Cl.
CPC ......... *H10N 60/85* (2023.02); *H10N 60/0661* (2023.02); *H10N 60/0772* (2023.02); *H10N 60/0884* (2023.02)

(58) Field of Classification Search
CPC .................................................... H10N 60/85
See application file for complete search history.

(56) References Cited

U.S. PATENT DOCUMENTS

2020/0028063 A1*  1/2020  Braeuninger-Weimer ................. H10N 60/857

FOREIGN PATENT DOCUMENTS

DE    102008047334 A1    3/2010
EP    0 417 733 A2       3/1991
(Continued)

OTHER PUBLICATIONS

Duan et al, Sci. Rep., 4, 6968 DOI:10.1038/srep06968 (Year: 2014).*

(Continued)

*Primary Examiner* — William D Young
(74) *Attorney, Agent, or Firm* — MASCHOFF BRENNAN; Michael Mauriel

(57) ABSTRACT

Compositions of matter and methods of identifying and making compositions of matter are disclosed. Some embodiments disclose making and chemically and/or compositionally tuning superconducting hydride materials. Some embodiments disclose an apparatus for making and compositionally tuning superconducting materials. Some embodiments disclose a composition of matter including a solid hydride exhibiting superconductivity at a temperature of at least 150 kelvin at an ambient pressure below 180 gigapas- (Continued)

cals, or at a temperature of at least 261 kelvin. In one or more embodiments, the superconductor includes a covalent metal hydride having at least three different chemical elements wherein an inter-atomic distance between the hydrogen in the covalent metal hydride is in a range of 1.1-2 angstroms. In yet further examples, the superconductor is formed using molecular exchange and compression of a Van der Waals solid. In yet further examples, the superconductor comprises molecular hydrogen disposed in 1-dimensional channels. These and other embodiments are disclosed herein.

6 Claims, 10 Drawing Sheets

(56) References Cited

FOREIGN PATENT DOCUMENTS

| EP | 1 683 758 A1 | 7/2006 |
|---|---|---|
| WO | 2022020399 A1 | 1/2022 |
| WO | 2022055628 A2 | 3/2022 |
| WO | 2023064019 A3 | 4/2023 |

OTHER PUBLICATIONS

Sun et al, "Computational discovery of a dynamically stable cubic . . . " Physical Review B, 101, 174102, May 2020. (Year: 2020).*
Bi et al., "The Search for Superconductivity in High Pressure Hydrides," Reference Module in Chemistry, Molecular, 2019, doi:10.1016/B978-0-12-409547-2.11435-0, 73 pages.
Choi et al., "3D strain-induced superconductivity in La2CuO4+δ using a simple vertically aligned nanocomposite approach," Science Advances, Apr. 2019, vol. 5, Issue 4, 11 pages.
Drozdov et al., "Conventional superconductivity at 203 kelvin at high pressures in the sulfur hydride system," Nature, 2015, vol. 525, No. 7567, 11 pages.
Drozdov et al., "Superconductivity at 250 K lanthanum hydride under high pressures," Nature, May 2019, vol. 569, 13 pages.
Engelmann et al., "Strain induced superconductivity in the parent compound BaFe2As2," Nature Communications, Dec. 2013, DOI: 10.1038/ncomms387, 6 pages.
Hasan et al. "Strain-induced superconductivity in RuO2," https://www.paradim.org/sites/default/files/2020-08/Hasan_Final_Report-converted.pdf, 2 pages.
International Preliminary Report on Patentability issued in International Application PCT/US2021/042447 dated Feb. 2, 2023, 9 pages.
International Preliminary Report on Patentability issued in International Application PCT/US2021/043785 dated Feb. 9, 2023, 11 pages.
International Search Report and Written Opinion issued in International Application PCT/US2021/042447 dated Oct. 19, 2021, 11 pages.
International Search Report and Written Opinion issued in International Application PCT/US2021/043785 dated May 23, 2022, 14 pages.
Kim, et al., "Deterministic Nanoassembly of Quasi-3-D Plasmonic Nanoarrays with Arbitrary Substrate Materials and Structures, " Nano Lett., Aug. 2019, vol. 19, No. 8, 25 pages.
Lamichhane et al., "X-ray Diffraction and Equation of State of the C-S-H Room-Temperature Superconductor," The Journal of Chemical Physics, 2021, vol. 155, No. 11, 14 pages.
Lin et al., "Structure and unconventional dihydrogen bonding of a pressure-stabilized hydrogen-rich (NH3BH3)(H2)x (x=1.5) compound," A Journal of Materials Chemistry, 2017, vol. 5, No. 15, 7 pages.
Liu et al., "Potential high-Tc superconducting lanthanum and yttrium hydrides at high pressure," PNAS, Jul. 2017, vol. 114, No. 27, 6 pages.
Pickard et al., "Superconducting hydrides under pressure," Annual Review of Condensed Matter Physics, 2020, vol. 11, 29 pages.
Salke et al., "Synthesis of clathrate cerium superhydride CeH9 at 80-100 GPa with atomic hydrogen sublattice," Nature Communications, vol. 10, No. 4453, 2019, 10 pages.
Snider et al., "Room Temperature Superconductivity in a Carbonaceous Sulfur Hydride," Nature, 2020, vol. 586, No. 7837, 26 pages.
Somayazulu et al., "Evidence for superconductivity above 260 K in lanthanum superhydride at megabar pressures," Phys Rev Lett, 2019, vol. 122, No. 027001, 33 pages.
Strobel et al., "Novel Cooperative Interactions and Structural Ordering in H2S-H2," Physical Review Letters, Dec. 2011, vol. 107, No. 25, 5 pages.
Yajima et al., Epitaxial Thin Films of ATiO(3-x)H(x) (A=Ba, Sr, Ca) with Metallic Conductivity. J Am Chem Soc, May 2012, vol. 134, No. 21, 4 pages.
Wofford et al., "A hybrid MBE-based growth method for large-area synthesis of stacked hexagonal boron nitride/graphene heterostructures," Sci Rep, Feb. 2017, vol. 7, No. 43644, 10 pages.
Yuan et al., "Arrayed van der Waals Vertical Heterostructures based on 2D GaSe Grown by Molecular Beam Epitaxy," Nano Lett., 2015, vol. 15, No. 5, 23 pages.
International Preliminary Report on Patentability issued in International Application PCT/US2022/038408 dated Feb. 15, 2024, 20 pages.
International Search Report and Written Opinion issued in International Application PCT/US2022/038408 dated Jun. 9, 2023, 25 pages.
Grockowiak A D et al., "Hot Hydride Superconductivity above 550 K", arxiv.org, Cornell University Library, 201 Olin Library Cornell University Ithaca, NY 14853, Jun. 4, 2020 (Jun. 4, 2020), XP081691721, 30 pages.
"Dias Investigation Committee Report, University of Rochester, Report Issued: Feb. 8, 2024," *Dias* v. *University of Rochester*, Ex—B (copy of the Final Investigation Report) Motion No. 2 (Affirmation of David Figlio, Ph.D. and Certification of the Record), Nyscef Doc No. 47, Index No. E2024003035 Monroe County, NY Sup Ct., Filed: Mar. 28, 2024, 130 pages.
"Response to University of Rochester Investigation Committee's Draft Report , Response Submitted by: Professor Liyanagamage R. Dias, Ph.D., Response Issued: Feb. 29, 2024," *Dias* v. *University of Rochester*, Ex—C (copy of Dr. Dias Jan. 29, 2024 comments) in Motion No. 2 (Affirmation of David Figlio, Ph.D. and Certification of the Record), Nyscef Doc No. 48, Index No. E2024003035 Monroe County, NY Sup Ct., Filed: Mar. 28, 2024, 176 pages.
"Supplemental Response to University of Rochester Investigation Committee's Draft Report, Supplemental Response Submitted by: Professor Liyanagamage R. Dias, Ph.D., Supplemental Response Issued: Feb. 21, 2024," *Dias* v. *University of Rochester*, Ex—F (copy of Dr. Dias Feb. 21, 2024 Supplemental Response), Motion No. 2 (Affirmation of David Figlio, Ph.D. and Certification of the Record), Nyscef Doc No. 51, Index No. E2024003035 Monroe County, NY Sup Ct., Filed: Mar. 28, 2024, 123 pages.

* cited by examiner

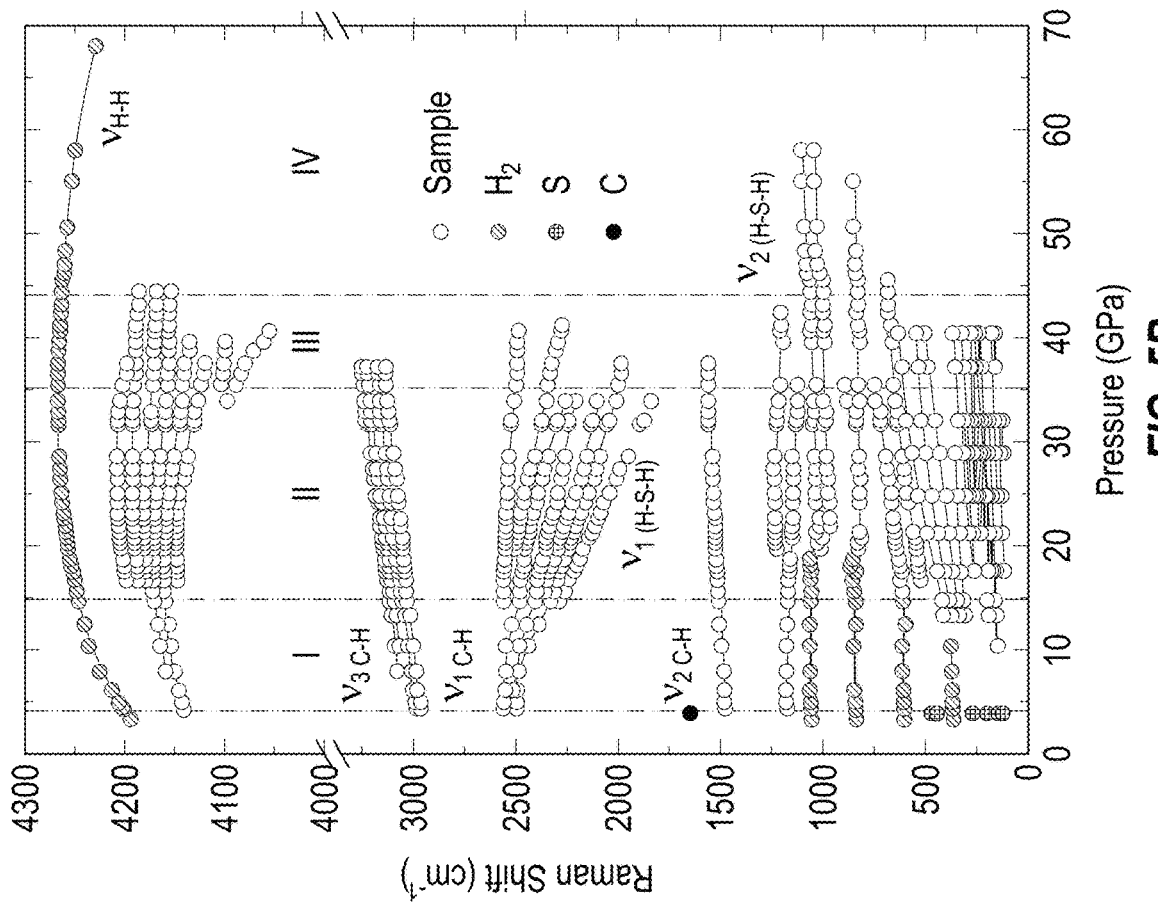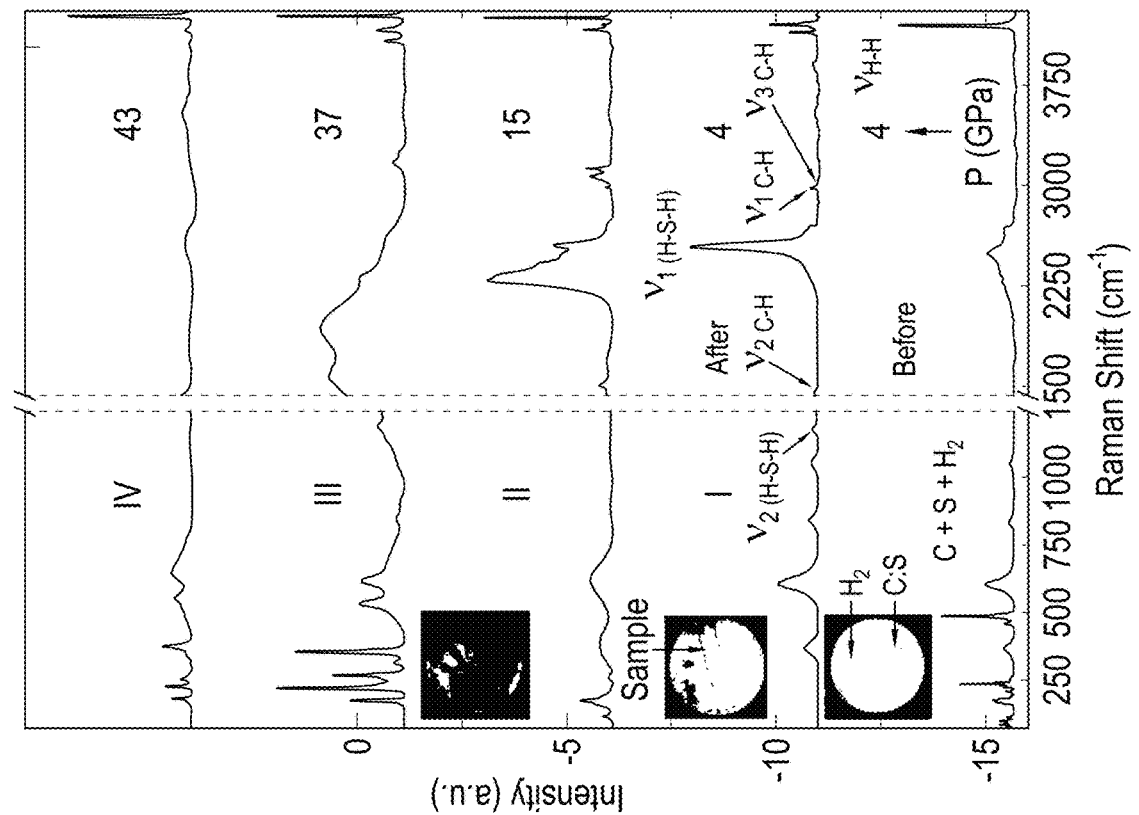
FIG. 5A
FIG. 5B

SUPERCONDUCTING HYDRIDE MATERIALS AND METHODS OF MAKING AND IDENTIFYING SAME

CROSS-REFERENCE TO RELATED APPLICATIONS

This application is a U.S. National Phase application under 35 U.S.C. § 371 of International Application No. PCT/US2021/042447 filed on Jul. 20, 2021, and claims the benefit of U.S. Provisional Application Nos. 63/054,105 and 63/054,111, filed on Jul. 20, 2020. To the extent permitted in applicable jurisdictions, the entire contents of these applications are incorporated herein by reference, as are all publications cited below.

STATEMENT REGARDING GOVERNMENT SUPPORT

This invention was made with government support under grant number DMR1809649 awarded by the National Science Foundation. The government has certain rights in the invention.

BACKGROUND OF THE INVENTION

The present disclosure relates to superconducting compositions of matter and methods of making the same.

Superconductivity has been known for over 100 years. However, materials developed to date do not exhibit superconductivity at ambient conditions that are sufficiently close to those necessary for many practical applications. Developing materials that can exhibit superconductivity at commercially viable temperature and pressure conditions is necessary to leverage the significant potential benefits of superconductivity on a larger scale.

SUMMARY OF THE INVENTION

The search, synthesis, and structural and physical characterization of novel materials with high superconducting transition temperature needed for observation of room temperature superconductivity (RTSC), and an understanding of how to access metastable pathways to their recovery to ambient conditions, is critical for the advancement of material science and energy transmission technology. Limitations with the energy storage produced from renewable energy technologies can be overcome with superconductors providing an extremely efficient means of storing and recovering energy on demand, as well as a method for transferring energy over long distances. A robust superconductor, suitable for the construction of Josephson junction quantum logic gates that can operate at higher temperatures has the potential to provide a revolutionary new switching mechanism for computing.

Higher temperature conventional superconductivity in hydrogen-rich materials has been reported in several systems under high pressure. See, Drozdov, A. P., Eremets, M. I., Troyan, I. A., Ksenofontov, V. & Shylin, S. I. Conventional superconductivity at 203 kelvin at high pressures in the sulfur hydride system, *Nature* 525, 73-76 (2015); Drozdov, A. P. et al. Superconductivity at 250 K in lanthanum hydride under high pressures, *Nature* 569, 528-531 (2019); and Somayazulu, M. et al. Evidence for Superconductivity above 260 K in Lanthanum Superhydride at Megabar Pressures, *Phys. Rev. Lett.* 122, 27001 (2019). However, these materials previously identified and made do not exhibit superconductivity at a combination of pressures and temperatures needed for most commercial applications. The present disclosure addresses this need.

In one aspect, embodiments disclosed include compositions of matter exhibiting superconductivity. Specifically, various hydrides exhibiting superconductivity at more favorable pressures and temperatures are disclosed.

In another aspect, methods of making these materials are disclosed. In a further aspect, embodiments of the present disclosure include methods for identifying materials that exhibit superconductivity at more favorable pressures and temperatures. Particular disclosed embodiments provide techniques for chemical tuning within ternary and quaternary hydrogen-rich systems to identify materials that are superconductive under such conditions.

BRIEF DESCRIPTION OF THE DRAWINGS

Referring now to the drawings in which like reference numbers represent corresponding parts throughout:

FIG. 3A: Temperature-dependent electrical resistance of the C—S—H system at high pressures, showing the superconducting transitions as high as 287 K at 267+/−10 GPa. The data were obtained during the warming cycle to minimize the electronic and cooling noise. Note that the left Y-axis and right Y-axis represent results from two different experimental runs. Inset: Microphotograph, illustrating the superconducting C—S—H sample with electrical leads in a four-probe configuration for resistance measurements. FIG. 3B: The pressure dependence of the $T_c$ as determined by sharp drop in electrical resistance and ac susceptibility measurements from FIGS. 3a and 4a. In the legend "ρ" and "χ" are values from resistivity and ac susceptibility measurements, respectively. The $T_c$ increases with pressure from ~140 GPa, plateaus around 220 GPa, and then sharply increases afterwards showing a discontinuity around 225 GPa. The highest $T_c$ observed was 287 K at 267 GPa. The low temperature pseudo-four resistance at 271 GPa (the highest pressure measured), shows a superconducting transition at ~280 K. The solid lines are to guide the eye, and the colors represent different experiments. The red and black arrows represent the room temperature and freezing point of the water, respectively.

FIG. 4a: Real part of the ac susceptibility in nV versus temperature for the C—S—H system at select pressures from run 2 showing significant diamagnetic shielding of the superconducting transition for pressures between 160-190 GPa. The superconducting transition shifts rapidly under pressure to higher temperatures. $T_c$ is determined from the temperature at the transition midpoint. The background signal determined from a non-superconducting C—S—H sample at 108 GPa has been subtracted from the data. FIG. 4B: Low-temperature electrical resistance behavior under magnetic field of at H=0 T, 1 T, 3 T, 6 T and 9 T (increasing from right to left) at 267 GPa. Inset: Upper critical field versus temperature for 220 GPa and 267 GPa, fit to the Ginzburg-Landau (GL) and conventional Werthamer, Helfand, and Hohenberg (WHH) models. At 220 GPa, the maximum field studied was 7 T.

FIGS. 5A-5B: Pressure-induced Raman changes of the photochemical product of C+S+H₂ mixtures. FIG. 5A Pressure-induced Raman changes of the photochemical product of $C+S+H_2$ mixture, showing the sulfur, carbon and fluid hydrogen (black) before the photochemical process at 4 GPa and spectral evidence of a photochemically transformed $H_2S+CH_4+H_2$ crystal at 4 GPa (blue). Note that no sulfur or carbon Raman modes are present in the sample after the photochemical process, indicating a synthesis of a new molecular compound. Inset: Microphotograph of a synthesized transparent crystal at 4 GPa. At ~15 GPa (red), the solid undergoes a phase transition remarked by the appearance of new lattice modes, splitting of the $H_2S$ modes, and further splitting of the $H_2$ vibron. Several new lattice modes appear above 37 GPa (purple), suggesting another phase transition. All the modes disappear above 60 GPa due to the photoproduct undergoing an insulator to metal transition. FIG. 5B: Pressure vs Raman frequencies up to 60 GPa, showing the spectral changes associated with the photochemistry of the $C+S+H_2$ mixture at 4 GPa, the phase transition of photoproduct at 15 GPa, and additional transitions at 37 GPa. The symbols correspond to the experimental data points, whereas the line represents the polynomial fits.

DETAILED DESCRIPTION OF EMBODIMENTS OF THE INVENTION

In the following description of embodiments of the invention, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

The present disclosure reports on methods and devices for making hydride superconductors having novel structures, compositions, and chemical environments for hydrogen. As illustrated herein, the structures, compositions, and chemical environments are tuned or tailored to achieve superconductivity at commercially relevant pressures and temperatures. FIGS. 1-9 illustrate various examples of a composition of matter, comprising a solid hydride exhibiting superconductivity at a temperature of at least 150 kelvin at an ambient pressure below 180 gigapascals, or at the temperature of at least 261 kelvin. In one or more further examples, the solid hydride exhibits the superconductivity at the temperature of at least 160 kelvin, at least 170 kelvin, at least 180 kelvin, at least 200 kelvin, at least 277 kelvin, and/or at least 280 K. In some examples, the composition of matter is a superconductor at the temperature in a range of 160 kelvin to 500 kelvin.

Example 1: Manufacturing Process

Figure 1:
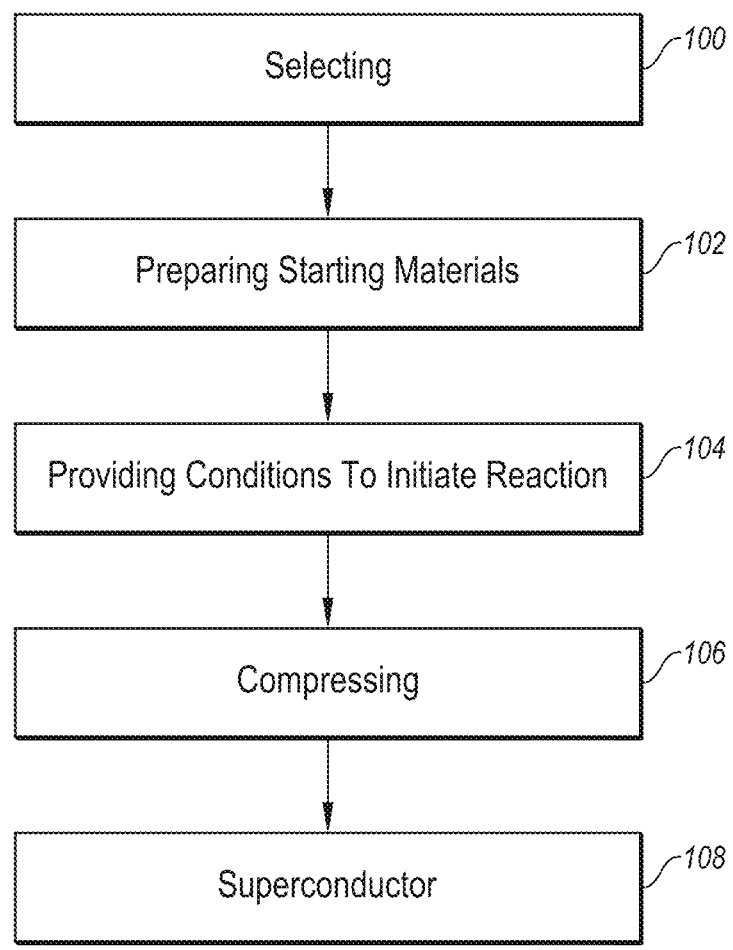
FIG. 1: Flowchart illustrating a method of making a superconductor.

FIG. 1 is a flowchart illustrating a method of making superconductor according to one or more examples.

Block 100 represents selecting two or more different materials each including one or more constituent elements. Example constituent elements include, but are not limited to, sulfur (S), lithium (Li), boron (B), beryllium (Be), magnesium (Mg), manganese (Mn), iron (Fe), scandium (Sc), nitrogen (N), selenium (Se), phosphorus (P), yttrium (Y), carbon (C), or lanthanum (La) from the periodic table of the elements. Materials may be selected for their properties as stabilizing agents, pressurizing agents, or chemical dopants as described herein.

Block 102 represents optionally preparing the two more different materials. In one or more examples, the step includes mixing the different materials in powder form and milling the powder to produce the powder including particles having a diameter less than 10 micrometers.

Block 104 represents providing conditions that initiate a reaction between two or more different materials (each having one or more constituent elements) and hydrogen so as to form a plurality of molecules each comprising a hydrogen moiety and at least one of the constituent elements from a different one of the materials. In an example with two different molecules, the plurality of molecules comprise a first molecule having a first composition and a second molecule comprising a second composition. In one or more examples, the first molecule comprises a sulfur hydride (e.g., $H_2S$) and the second molecule comprises a carbon hydride (e.g., methane).

The hydrogen can be provided in various forms or in various hydrogen precursors. Example hydrogen precursors include, but are not limited to, atomic hydrogen, molecular hydrogen, a hydrogen polymer, or a multi-valent hydride. More specific of hydrogen precursors include, but are not limited to, methane, HS, Silane, LiH, or any hydrogen precursor (e.g., gaseous hydrogen precursor) used in molecular beam epitaxy or chemical vapor deposition.

In one or more examples, the conditions that initiate the reaction include applying pressure and irradiating with electromagnetic radiation having an intensity greater than 10 milliwatts for at least 2 hours. In one or more further examples, the intensity is less than 10 milliwatts and the duration of irradiation is extended. Example pressure includes, but it not limited to, a pressure in a range of 3-5 gigapascals and/or a pressure that does not solidify the hydrogen.

In yet further examples, the condition (e.g., the irradiating and the pressure) enables molecular exchange between the plurality of molecules and increases a coordination number of one or more of the constituent elements of the molecules to at least 6. In one or more examples, the different molecules are disposed at different positions in a lattice and the molecular exchange comprises exchange, substitution, or swapping of the different molecules between sites in the lattice (i.e., the first molecule switching position with the second molecule in the lattice). In one or more examples, the molecular exchange comprises the protons from the first molecule (or atoms in the first molecule) exchanging with the protons in the second molecule (or atoms in the second molecule). In one or more examples, proton exchange can be measured using femtosecond spectroscopy techniques.

In one or more examples, the conditions (e.g., the irradiating and the pressurizing) form the plurality of molecules into a Van der Waals solid so that the plurality of molecules interact via Van der Waals forces.

In one or more further examples, at least one of the materials comprises a precursor compound including a plurality of the constituent elements (e.g., sulfur) and the irradiating causes photoscission of precursor compound into its constituent elements so as to allow formation of a bond between at least one of the constituent elements and the hydrogen moiety. In this case, the electromagnetic radiation has an intensity and wavelength tuned for the photoscission breaking chemical bonds between the constituent elements (e.g., sulfur) in the precursor compound.

Block 106 represents providing conditions that tune an intra-atomic and intermolecular distance of the plurality of molecules so as to form a solid compound comprising the superconductor including the constituent elements and the hydrogen. Intra-atomic and intermolecular distance tuning may also be achieved by proper selection of pressurizing agents, stabilizing agents, or chemical doping/dopants in Block 100.

In one or more examples, the step comprises applying a pressure in a range of 3-300 gigapascals to convert the Van der Waals solid into a solid compound (e.g. covalent solid compound).

Block 108 represents the end result, a superconductor manufactured according to the method of FIG. 1. Example superconducting compositions of matter include, but are not limited to, structures described in examples 3-8 discussed below or combinations of the structures described in examples 3-8 and 10 below.

In one or more examples, the superconductor comprises a solid hydride including a first component A comprising a hydrogen-containing component including the hydrogen; a second component B and a third component C; and the solid hydride has the formula $A_aB_bC_cH_x$; wherein C is H in a ternary compound and C is different from H in a quaternary compound, b:c is in a range of 1:20 to 20:1., a:b is in a range of 1:20 to 20:1, x is in a range from 1 to 15, and A, B, or C are independently selected from Li, B, Be, Mg, Mn, Fe, Sc, N, Se, P, Y, C, S, or La. A, B, or C can be substituted with other elements from the list or other elements to reflect doping (e.g., doping with other elements up to 20%).

Example 2: Apparatus

Figure 2A:
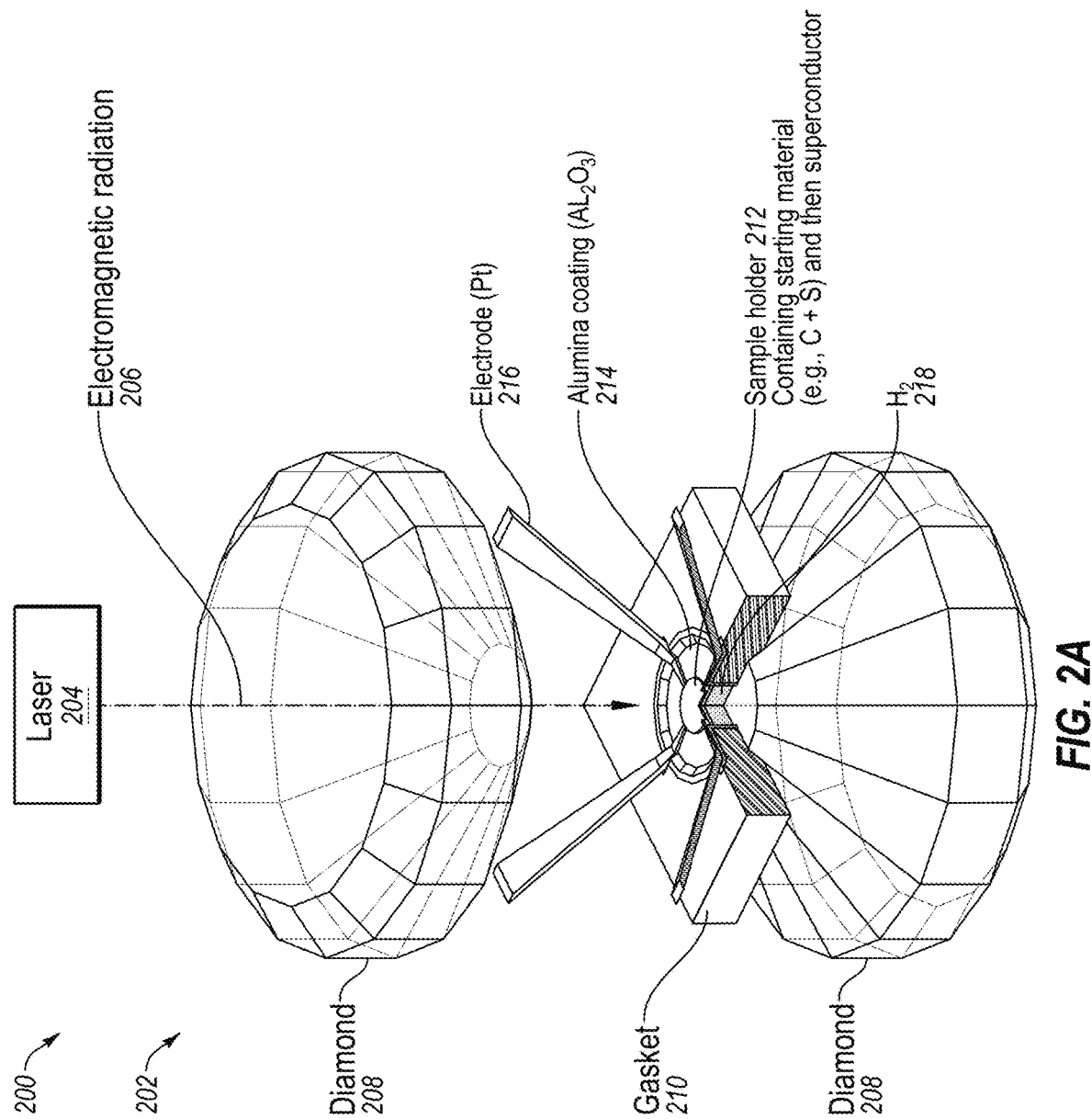
FIGS. 2A and 2B: Schematic of an apparatus for making a superconductor.
Figure 2B:
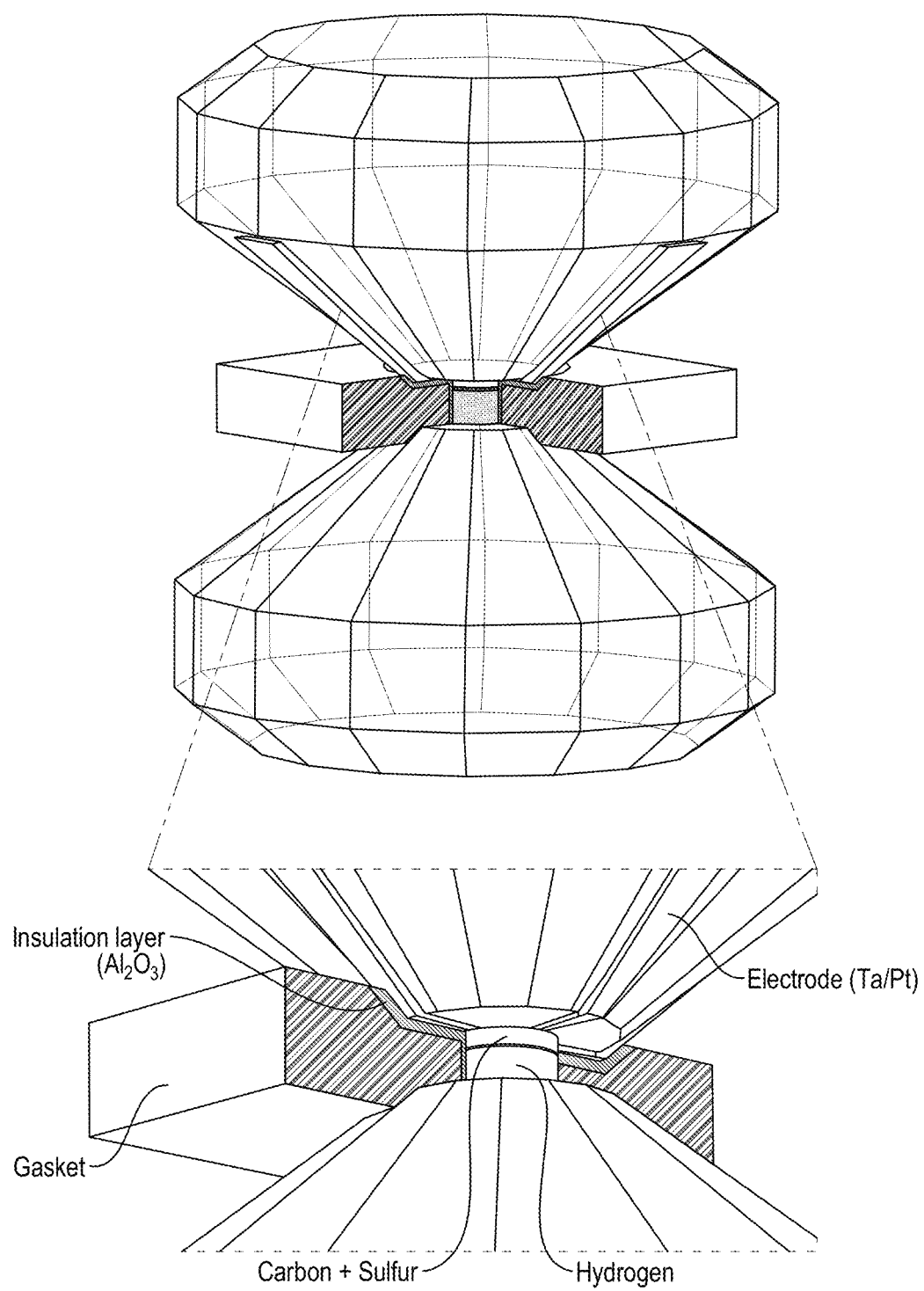

FIGS. 2A and 2B illustrate an example apparatus 200 for manufacturing a superconductor according to examples described herein.

The apparatus includes a pressure device 202 for applying pressure up to at least 300 gigapascals; and a laser 204 coupled to the pressure device. The laser outputs electromagnetic radiation 206 having a wavelength and intensity configurable to provide conditions, in combination with the pressure applied using the pressure cell, that initiate the reaction between the starting materials (e.g., the different materials comprising the constituent elements) and the hydrogen 208 as described in Block 104, FIG. 1).

In the example shown, the pressure device comprises an anvil cell comprising diamond anvils 208 and a gasket 210 at a junction between the anvils 208. The gasket includes a sample holding region (e.g., sample holder 212 or container) for holding and containing the starting materials and the sample. In various examples, the sample holding region comprises an insulative layer 214 (e.g., alumina coating) on the gasket. A plurality of electrodes 216 are also provided on or above the gasket (but electrically isolated from the gasket through the alumina coating or insulative layer) to apply voltages to, and measure various electrical properties of, the sample at various stages of the manufacturing process. The apparatus further includes a conduit for conveying the hydrogen/hydrogen precursor 218 to the sample holding region.

Example 3: Experimental Results for a Superconductor Comprising Carbon, Sulfur, and Hydrogen A superconductor manufactured using the following process has been characterized.

A. Manufacturing Process

The starting compound was synthesized by combining elemental carbon and sulfur with a mole ratio of 1:1. The mixture was ball-milled to a particle size less than 5 μm and then loaded into a diamond anvil cell (DAC), after which molecular hydrogen was gas loaded at 3 kbar to serve as both reactant and pressure transmitting medium (PTM). Raman scattering was used to confirm the presence of the starting materials in the DAC, and the sample was compressed to 3.9 GPa and exposed to 532 nm laser light for several hours at a power of 10-25 mW. irradiating $\alpha$-$S_8$ with these wavelengths of tight at these pressures is known to drive a photoscission of S—S bonds which produces S free radicals that either self-react to form different chain structures, or in this case react with $H_2$ to form $H_2S$. Slight adjustments were made in the pressure and laser position until the rapid formation of a uniform and transparent crystal that does not display Raman features from either elemental sulfur or $sp^2$ carbon. The molecular $H_2$ $Q_1(J)$ vibron of the excess PTM was observed throughout, unperturbed and present up to the highest pressures.

The following various allotropes and phases of carbon should be noted for reference: Diamond (including natural and synthetic, covering 1a, 1b, 2a, 2b, 2ac, 2as; cubic; hexagonal; lonsdaleite), graphite (including natural and synthetic; amorphous, flake, and crystalline vein graphite; graphyne and graphdiyne), fullerene (including C60, C70, and fullerenols; empty or filled with fullerenes ("peapods")), carbon nanotubes (including armchair carbon nanotubes, zigzag carbon nanotubes, and chiral carbon nanotubes; single-walled carbon nanotubes ("SWCNTs"); multi-walled carbon nanotubes ("MWCNTs"); nanohorns [8], spherical multi-layer carbon particles ("carbon onions"); carbyne), glassy carbon (including various amounts of sp2 to sp3 hybridization; type II glass carbon GL-200 heated; fullerene-related structure of commercial glassy carbons), amorphous carbon (including various amounts of sp2 to sp3 hybridization), M carbon, and W carbon.

B. Characterization

Superconductivity Measurements

Figure 3A:
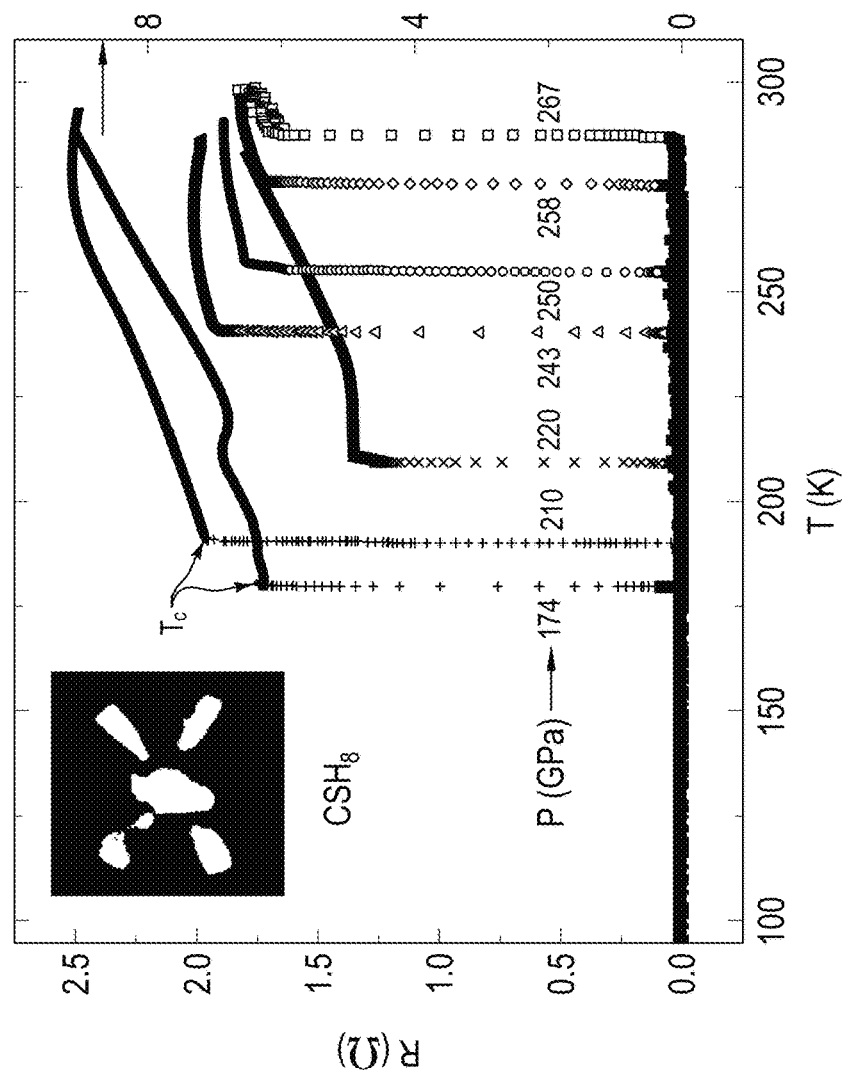
FIGS. 3A-3B: Superconductivity in C—S—H at high pressures.
Figure 3B:
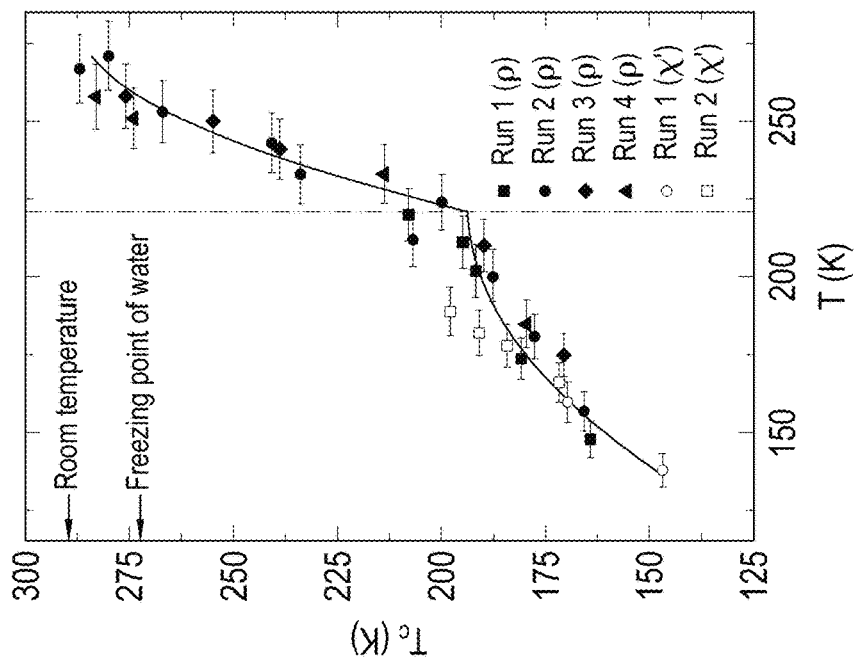

The most striking result of the present study is the superconducting transition, in which the photochemically synthesized C—S—H system becomes superconducting with highest critical temperature ($T_c$) of 287 K at 267+/−10 GPa. The transition is evidenced by a sharp drop in resistance towards zero within a less than 1 K temperature change (FIG. 3a). The low-temperature resistance data were obtained during the natural warming cycle (~0.25 K/min) with a current of 10 microAmps to 1 mA. In all experiments the reported pressure was measured from the diamond edge using the Akahama 2006 scale. The accuracy of the temperature probe is +/−0.1 K, and the transition temperature was determined from the onset of superconductivity. The transition temperature increases with pressure from 147 K at 138+/−7 GPa until it plateaus at about 220 GPa, indicating a dome shape (see FIG. 3b). Remarkably, a sharp increase in $T_c$ is observed above 220 GPa with a rate of around 2 K/GPa (FIG. 3b). The highest pressure studied was 271 GPa, there the material exhibits a $T_c$ of ~280 K. Additionally, no change in the shape of the superconducting transition is observed if the current is reduced to 0.1 mA, hence indicating bulk, rather than filamentary, superconductivity. These results were confirmed by a large number of experiments with over three dozen samples. Note that the resistance of the sample decreases with increasing pressure, showing that it becomes a better metal at higher pressures.

Figures 4A, 4B:
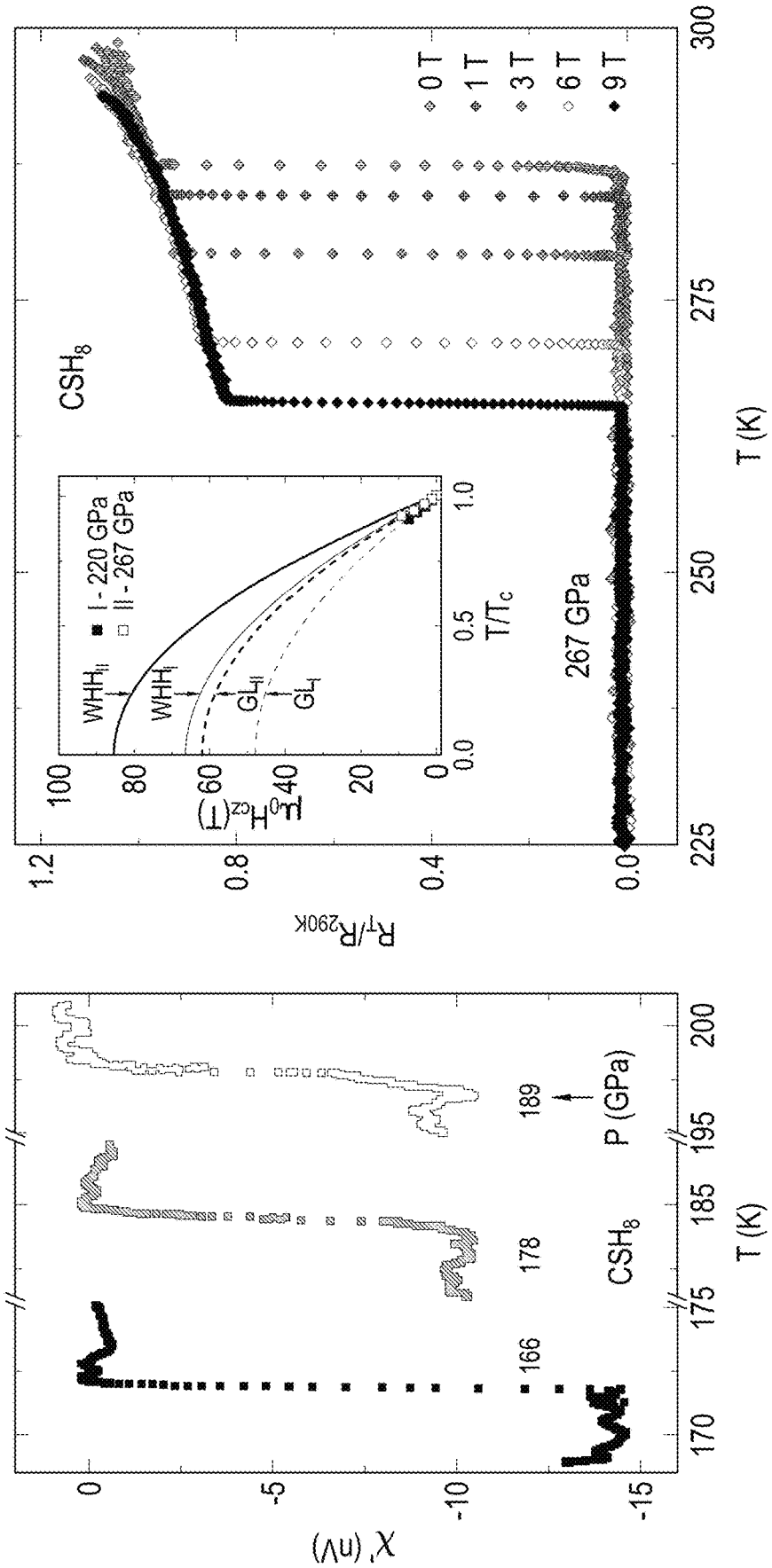
FIGS. 4A-4B: Magnetic susceptibility and superconducting transition under an external magnetic field.

A superior test for superconductivity is the search for a strong diamagnetic transition in the ac magnetic susceptibility. In FIG. 4a, the real part of the temperature-dependent ac magnetic susceptibility $\chi'(T)$ of the sample is shown for one of the experimental runs. The onset of superconductivity is signaled by a large (10-15 nV), sharp drop in susceptibility indicating a diamagnetic transition, which shifts to higher temperatures with increasing pressure. The highest transition temperature measured in this way is at 198 K (transition midpoint) reached at the highest pressure measured (189 GPa). The quality of the data is high given the small sample size (~80 mm in diameter and 5 to 10 mm in thickness). However, at extremely high pressures (>200 GPa), measuring magnetic susceptibility becomes increasingly difficult and impossible with sample diameters less than about 70 µm. Our typical samples are about 25-35 µm in diameter above 200 GPa.

To further confirm the superconducting transition at higher pressure we exploit the inherent hostility of an external magnetic field on superconductivity. The upper critical field, $H_c$, is the maximum external magnetic field that superconductivity can survive. This value is controlled by both the paramagnetic effect of electron spin polarization due to the Zeeman effect and the diamagnetic effect of orbital motion of the Cooper pairs due to the Lorentz force. Under an applied magnetic field, these effects combine to reduce the K. In the present study, the superconducting transition is suppressed by 22 K at 267 GPa in a 9 T magnetic field as is shown in FIG. 4b, confirming the superconducting transition. The transition was first measured at 210 GPa and followed by a second measurement at 267 GPa. The temperature dependence of the upper critical field, $H_c(T)$, can be expressed using the Ginzburg-Landau (GL) or conventional Werthamer, Helfand, and Hohenberg (WHH) model. Evaluating these relations at the limit of T=0 K at 267 GPa yields $H_{c2}(0)$=61.88 T with a coherence length of 2.31 nm for GL model. From the WHH model, in the dirty limit $H_{c2}(0)$ can be extrapolated from the slope of the H-T curve as $H_{c2}(0)=0.693|dH_{c2}/dT|_{T=T_C}T_C$, and this yields $H_{c2}(0)$=85.34 T (FIG. 4b, inset) with a coherence length of 1.96 nm. At 210 GPa, $H_{c2}(0)$ and the coherence length at T=0 are 47.74 T and 2.63 nm and 66.18 T and 2.23 nm for the GL and WHH models, respectively. The penetration depth can be identified as, $$\lambda(0) = \frac{\phi_0}{2\sqrt{2}\,\pi H_c(0)\xi(0)}$$

with $H_c(0)$=61.8 T, $\xi(0)$=2.3 nm $\lambda(0)$=3.8 nm. For type II superconductors, the GL parameter is defined by $$\kappa = \frac{\lambda(T)}{\xi(T)} > \frac{1}{\sqrt{2}},$$

where $\lambda(T)$ is the penetration depth and $\xi(T)$ is the coherence length. The calculated GL parameter is 1.1 for our experiments, which enables us to identify the C—S—H system as a Type II superconductor. The superconducting transition width is defined as $DT_c=T_{90\%}-T_{10\%}$, where $T_{90\%}$ and $T_{10\%}$ are the temperatures corresponding to 90% and 10% of the resistance at 290 K. The $DT_c$ at several magnetic fields remains essentially constant emblematic of a homogenous sample. Above the superconducting transition temperature, R(T) shows supralinear behavior described by $R(T)=R_0+AT^2$, with pre-factor A=2.53 $10^{-4}$ µΩmK$^{-2}$, which described by the inelastic electron-electron scattering within the Fermi liquid (FL) model (See FIG. 4b). At higher temperatures, one would typically anticipate an $R(T)\propto T$ dependence according to the Bloch-Gruneisen law for a free-electron metal at temperatures well above the Debye temperature. The unusual behavior indicates that $T^2$ term in R(T) is likely due to coupling to high-energy phonon modes as observed in $H_3S^7$.

(ii) Structural Characterization

Both $H_2S$ and $CH_4$ are known to form stable guest-host structures with $H_2$ under modest high pressures. See, Strobel, T. A., Ganesh, P., Somayazulu, M., Kent, P. R. C. & Hemley, R. J. Novel cooperative interactions and structural ordering in H2S—H2, *Phys. Rev. Lett.* (2011) doi:10.1103/PhysRevLett.107.255503. The binary phase diagram for $CH_4+H_2$ states that a mixed fluid phase should form at our experimental photochemical synthesis conditions, id, however the observed Raman modes associated with C—H stretches do not evolve as for the free molecule and the splitting of the $v_1$ and $v_3$ modes at 3.9 GPa clearly indicate $CH_4$ is in a solid phase. We do not observe the shift to higher frequency of the molecular $H_2$ $Q_1(J)$ vibron associated with the formation of $(CH_4)_2H_2$ or $(CH_4)H_2$, (see, id, and also see, Somayazulu, M. S., Finger, L. W., Hemley, R. J. & Mao, H. K. High-Pressure Compounds in Methane-Hydrogen Mixtures. *Science* (80-.). 271, 1400-1402 (1996)); implying that the $CH_4$ is mixed in with the E125+$H_2$ guest-host structure that is known to form under these conditions. Thus, the most likely compound form at 3.9 GPa is a mixed alloy of E125 and $CH_4$ in the host framework with stoichiometry, $(H_2S)_{2-x}(CH_4)_xH_2$. Ideally the stoichiometry is $(H_2S)(CH_4)H_2$ based on the composition of the starting materials. Molecular $H_2S$ and $CH_4$ have similar kinetic diameters, they both form plastic fcc phases with nearly identical lattice constants at 300 K and 4 GPa as pure solids, and their guest-host framework with $H_2$ are of similar dimensionality. These properties support the alloyed mixed van der Waals solid hypothesis, and our preliminary simulations indicate both the independent $X_2H_2$ and mixed $XYH_2$ guest-host compounds are stable (neglecting vibrational free energy contributions) with respect to atomization and the molecular references.

The Raman spectra of the transparent photoproduct formed at 3.9 GPa (FIG. 5) can be attributed to an H—S—H bending mode ($v_2$), S—H stretching mode ($v_1$), H—C—H bending mode ($v_2$), C—H stretching modes ($v_1+v_3$), and the splitting of the $H_2$ vibron; all of which together signify a $H_2S+CH_4+H_2$ van der Waals solid as described above. Compression above 10 GPa leads to the emergence of low frequency lattice modes in the Raman spectra that are indicative of increased periodicity in the sample. The I to II phase boundary at 15 GPa shows a similar progression as the guest-host structure as reported by Strobel et al. (cited above) including the emergence of the low frequency lattice modes, the splitting of the H—S—H bending and S—H stretching modes, as well as a further splitting of the $Q_1(J)$ vibron of the guest $H_2$. Thus, the phase transition can be described as a disorder-order-transition akin to what is seen in $(H_2S)_2H_2$ where the $H_2S$ molecular units align. In addition to the changes in the $H_2S$ related modes, the splitting between the $CH_4$ modes increases, corroborating an ordering of an alloyed host framework. Regime III of the Raman spectra begins at 37 GPa, and it reveals the emergence of new lattice modes, further splitting of the $H_2$ vibron, and the eventual disappearance of most Raman features. From this data, it can be concluded that another phase change is occurring at 37 GPa. The Raman signal s lost above 60 GPa and metallization is confirmed with transport measurements.

The results in FIGS. 3-5 demonstrate the first material capable of RTSC with a $T_c$ of 287(1) K at 267±10 GPa. This material is a ternary C—S—H system with behavior distinct from that of pure $H_3S$, whose the superconductivity dome eventually decreases as a function of pressure. See Drozdov, et al. *Nature* 525, 73-76 (2015) (cited above). "Compositional tuning" of these C—S—H ternary systems and other material systems or compositions as described herein through controlling molecular exchange at lower pressures can be a key forward to achieving very high $T_c$ superconductors that are stable (or metastable) at ambient pressure.

Example 4: Example Structure Having Reduced Inter-Atomic Spacing Between Hydrogen Atoms or Dimers FIG. 6 illustrates a first example of a composition of matter, comprising a solid hydride 600 exhibiting superconductivity or comprising a superconductor at a temperature of at least 150 kelvin at an ambient pressure below 180 gigapascals, or at a temperature of at least 261 kelvin.

Figure 6:
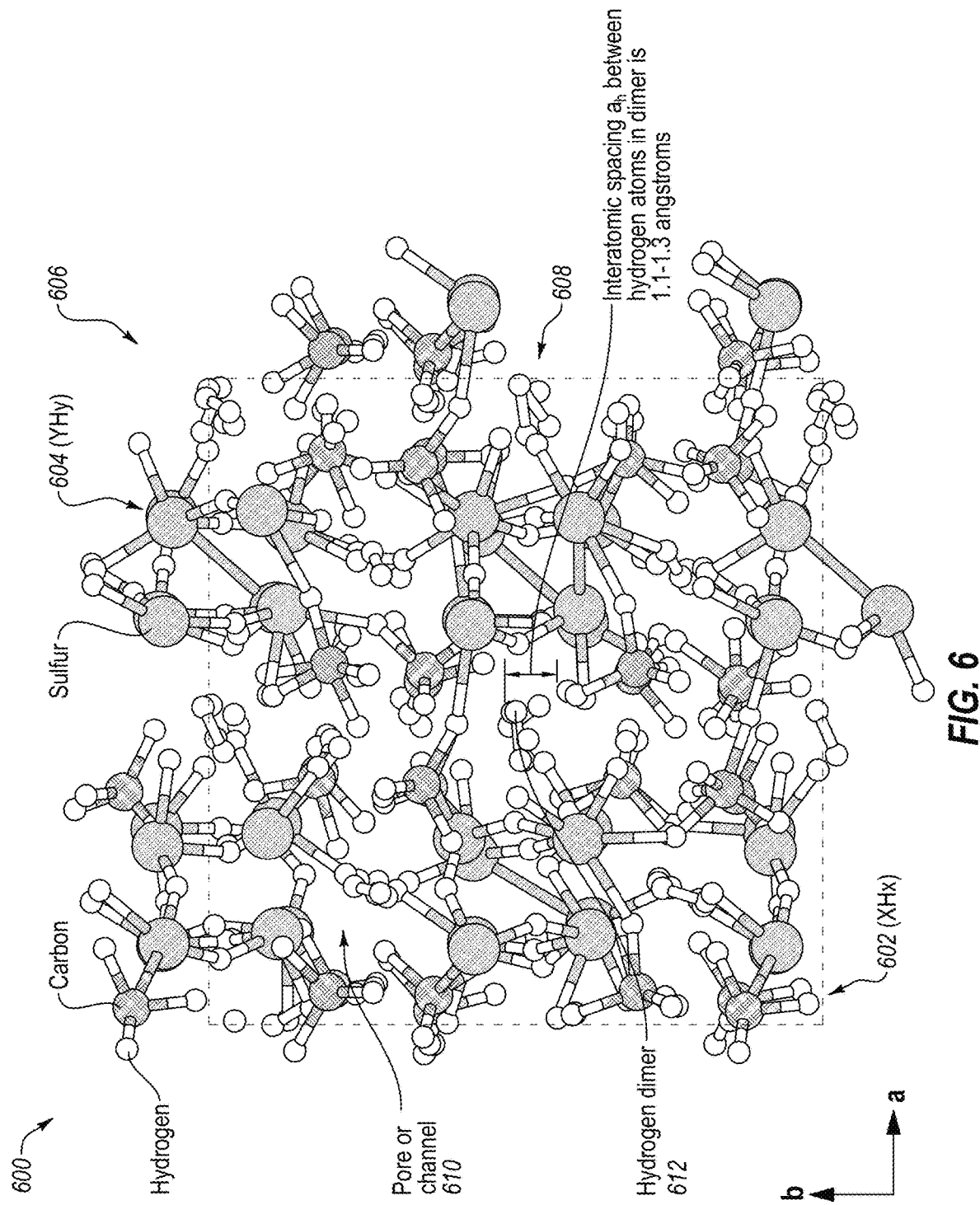
FIG. 6: Example structure of the superconductor characterized by the results in FIGS. 3-5 and measured at an ambient or environmental pressure of 270 gigapascals.

FIG. 6 illustrates an example structure of the superconductor 600 manufactured according to example 3 and comprising carbon, hydrogen, and sulfur. The structure comprises the carbon and sulfur disposed with periodic stacking within a three-dimensional motif. In one or more examples, the sulfur is disposed in a CmCm symmetrized motif and the overall structure is an Im-3m structure.

As illustrated herein, the sulfur and carbon can be substituted with different elements (e.g., as listed in Block 100, FIG. 1). In a more general example, the structure includes at least one of a stabilizing agent 602 (e.g., carbon, sulfur, or substitute for carbon or sulfur) or a pressurizing agent 604 (e.g., carbon, sulfur, or substitute for carbon or sulfur). The stabilizing agent promotes bonding of the hydrogen to surrounding lattice 606 and/or formation of a distinct network comprising at least some of the hydrogen. The pressurizing agent applies chemical pressure to the periodic lattice so as to reduce inter-atomic spacing in the lattice. In one or more examples, the pressurizing agent comprises an atom having a larger diameter or size than other atoms so as to reduce the inter-atomic spacing.

Example stabilizing agents 602 comprise a chemical constituent (comprising a molecule or atom) including at least one of Li, B, Be, Mg, Mn, Fe, Sc, N, Se, P, Y, or La. Example pressurizing agents 604 include a chemical constituent (e.g., atom or molecule) including at least one of Li, B, Be, Mg, Mn, Fe, Sc, Se, P, Y, or La. In various examples, the chemical constituent comprises both a stabilizing agent and pressurizing agent. Stabilizing agents and pressurizing agents may also be considered chemical dopants.

In various examples, the hydrogen framework (arrangement) 608 can be distinct from the second framework (arrangement) 606 containing any combination of two or more elements from the list C, S Li, B, Be, Mg, Mn, Fe, Sc, N, Se, P, Y, or La. The second framework (arrangement) may include each of those elements from the list separately bonded to hydrogen or other elements to form a lattice of compounds (e.g., so that compounds containing C, S, etc. are at different sites or points in the lattice).

FIG. 6 further illustrates an example wherein the inter-atomic distance $a_h$ between the hydrogen in the composition of matter is in a range of 1.1-1.3 angstroms (e.g., similar to that found in metallic hydrogen). The hydrogen atoms in the channels 610 form molecular hydrogen (dimers 612 or covalently bonded hydrogen pairs) wherein the sigma bonds in the molecular hydrogen are weakened as the bond order is lowered from 2 to possibly about 1.5. In other examples, the bond order is reduced as low as zero so that the hydrogen atoms in the channels comprise atomic hydrogen. As used herein, bond order is the number of chemical bonds between a pair of atoms and indicates the stability of a bond. For example, in diatomic hydrogen (hydrogen dimer, H—H), the bond order is 2; in atomic hydrogen, the bond order is 0. The inter-atomic distance in the range of 1.1-1.3 angstroms can be the distance between hydrogen atoms in the dimer and/or between adjacent neighboring hydrogen atoms or hydrogen dimers.

In yet further examples, the hydrogen in the channels or networks may be considered to comprise hydrogen atoms or dimers forming covalent bonds (e.g., directional bonds) with other neighboring hydrogen atoms or dimers as a consequence of the hydrogen atoms or dimers sharing electrons between them and overlapping, or hybridization of two or more atomic orbitals. In yet further examples, the hydrogen atoms or hydrogen dimers interact with their neighbors in the channel or pores through resonance bonding (e.g., similar to resonance bonding in benzene). In one or more examples, the hydrogen disposed in the channels or network comprises a self-interacting hydrogen rich network.

in one or more examples; the degree of covalency is increased in both the hydrogen dimer and with the surrounding environment. The pressurizing agent and the stabilizing agent may donate electron density to lower the bond order in the $H_2$ dimer. As the bond order in the dimer decreases the hydrogens may begin to become less distinguishable within the dimer and between the nearest neighbors.

FIG. 6 illustrates a solid hydride 600 comprising at least 3 different elements including hydrogen and exhibiting superconductivity (e.g., at a temperature of at least 170 kelvin). However, the solid hydride may also comprising at least 4 or more different elements including hydrogen and exhibit superconductivity (e.g. at a temperature of at least 100 kelvin).

Figure 7:
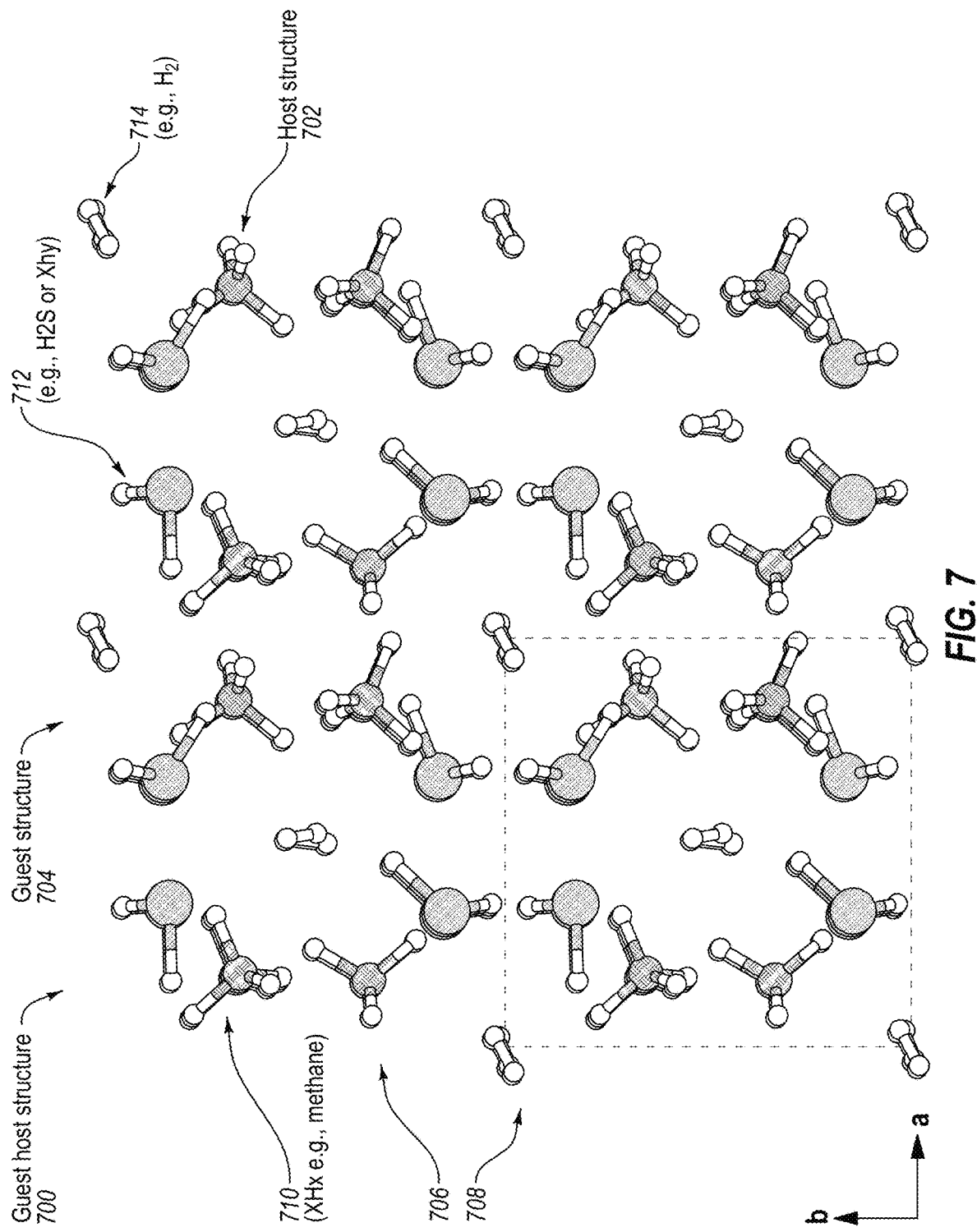
FIG. 7: Example structure (at 4 gigapascals ambient or environmental pressure) comprising three molecular systems in a Van der Waals solid prior to compression to form the structure of FIG. 6.

Example 5: Compositions Formed by Pairing or Combination of Chemical Constituents FIG. 7 illustrates a superconducting composition of matter formed by combining molecules $XH_x+YH_y+H_2$ or $XH_x+YH_y+ZH_z+H_2$, wherein X=Li, B, Be, Mg, Mn, Fe, Sc, N, Se, P, Y, C, S, La, Y=Li, B, Be, Mg, Mn, Fe, Sc, N, Se, P, Y, C, S, La, and Z=Li, B, Be, Mg, Mn, Fe, Sc, N, Se, P, Y, C, S, La, and x, y, and z are the (e.g., stoichiometric) amounts of the compounds comprising X, Y, and Z, respectively. In the example of FIG. 7, the molecules comprise H2S and methane.

In various examples, the molecules are then compressed to form a compound, as illustrated in Block 106, FIG. 1. The molecules may comprise a Van der Waals solid 706 and/or may be disposed in a (e.g., periodic) lattice 708 or structure prior to compression. In other examples, additional molecules are included, e.g., to form a pentanary system. In the case of a Van der Waals solid, interactions between molecules may comprise Van der Waals forces.

Example 6: Compositions Formed by Molecular Exchange

Recent work has shown the pressure-driven disproportionation of hydrogen sulfide ($H_2S$) to H3S with a confirmed $T_c$ of 203 kelvin at 155 gigapascals. See Drozdov, et al. Nature 525, 73-76 (2015) (cited above). As $H_2S$ readily mixes with hydrogen to form guest-host structures at lower pressures, we consider the comparable size of methane to $H_2S$ should allow molecular exchange within a large assemblage of van der Waals solids that are (highly) hydrogen-rich with $H_2$ inclusions which can then be the building blocks for novel superconducting compounds at commercially relevant conditions.

In one or more examples, the superconducting composition of matter comprises a hydride having a structure formed using molecular exchange between different components of a Van der Waals solid precursor. The starting materials are selected so that the plurality of molecules formed in Block 104 (and illustrated in FIG. 7) have substantially similar or matched Van der Waals radii or kinetic diameters (e.g., within 10% of each other). Molecular exchange between these molecules with the same shape/size enables the formation of a hydrogen rich superconductor. Example molecules having substantially similar Van de Waals radii or kinetic diameters include, but are not limited to, $C_2H_2$, $C_2H_4$, $C_3H_8$, $CH_4$, $H_2S$ and $NH_3$. As used herein, kinetic diameter expresses the likelihood that a molecule will collide with another molecule and indicates the size of the molecule as a target (while being typically different from the actual physical size of the molecule).

As a result, the superconductor 600 or intermediate structure 700 comprises different chemical species (molecules or elements) having substantially similar Van der Waals radii or kinetic diameters (within 10% of each other) such that a content of the hydrogen in the superconductor 600 is super stoichiometric compared to (or higher than) a largest content possible as determined by formal oxidation states of the chemical constituents of the chemical species.

FIG. 7 further illustrates an example wherein the molecules (XHx and YHy) having substantially similar Van der Waals radii or kinetic diameters are disposed in a guest-host structure 700. The guest-host structure includes a host structure 702 and a guest structure 704, wherein at least one of the host structure or the guest structure comprises a periodic lattice 708 and the guest structure includes hydrogen (e.g., in atomic or molecular form, or in a hydrogen containing compound or hydrogen containing component 714). FIG. 7 illustrates the host structure comprises elements different from hydrogen (e.g., in the form of a compound or molecule 710, 712 comprising the elements different from hydrogen). In one or more examples, the hydrogen containing component and the non-hydrogen containing components are provided in stoichiometric amounts.

In some examples, the host structure comprises at least one of the stabilizing agent (710 and/or 712) or the pressurizing agent (710 and/or 712). As described herein, the stabilizing agent promotes bonding of the hydrogen to the host structure and/or formation of a distinct network comprising at least some of the hydrogen, and the pressurizing agent applies chemical pressure to the periodic lattice so as to reduce inter-atomic spacing in the lattice. In one or more examples, the stabilizing agent, the pressurizing agent, and the hydrogen containing component are provided in stoichiometric amounts.

In one or more examples, compression of the Van der Waals solid having the guest-host structure of FIG. 7 leads to the structure illustrated in FIG. 6. In one or more examples, as the Van der Waals solid is compressed to form the solid hydride, the degree of covalency is increased in both the hydrogen dimer and with the surrounding environment. For example, the pressurizing agent and the stabilizing agent may donate electron density to lower the bond order in the $H_2$ dimer. As the bond order in the dimer decreases the hydrogens may begin to become less distinguishable within the dimer and between the nearest neighbors. Thus, FIG. 7 illustrates another example of a composition of matter, wherein the solid hydride 600 exhibiting superconductivity or comprising a superconductor is formed from a Van der Waals solid 706 or guest-host structure 700 and wherein the composition of matter is a superconductor at a temperature of at least 150 kelvin at an ambient pressure below 180 gigapascals, or at a temperature of at least 261 kelvin.

Example 7: Hydrogen Networks, Channels, and Interatomic Spacing

Figure 8:
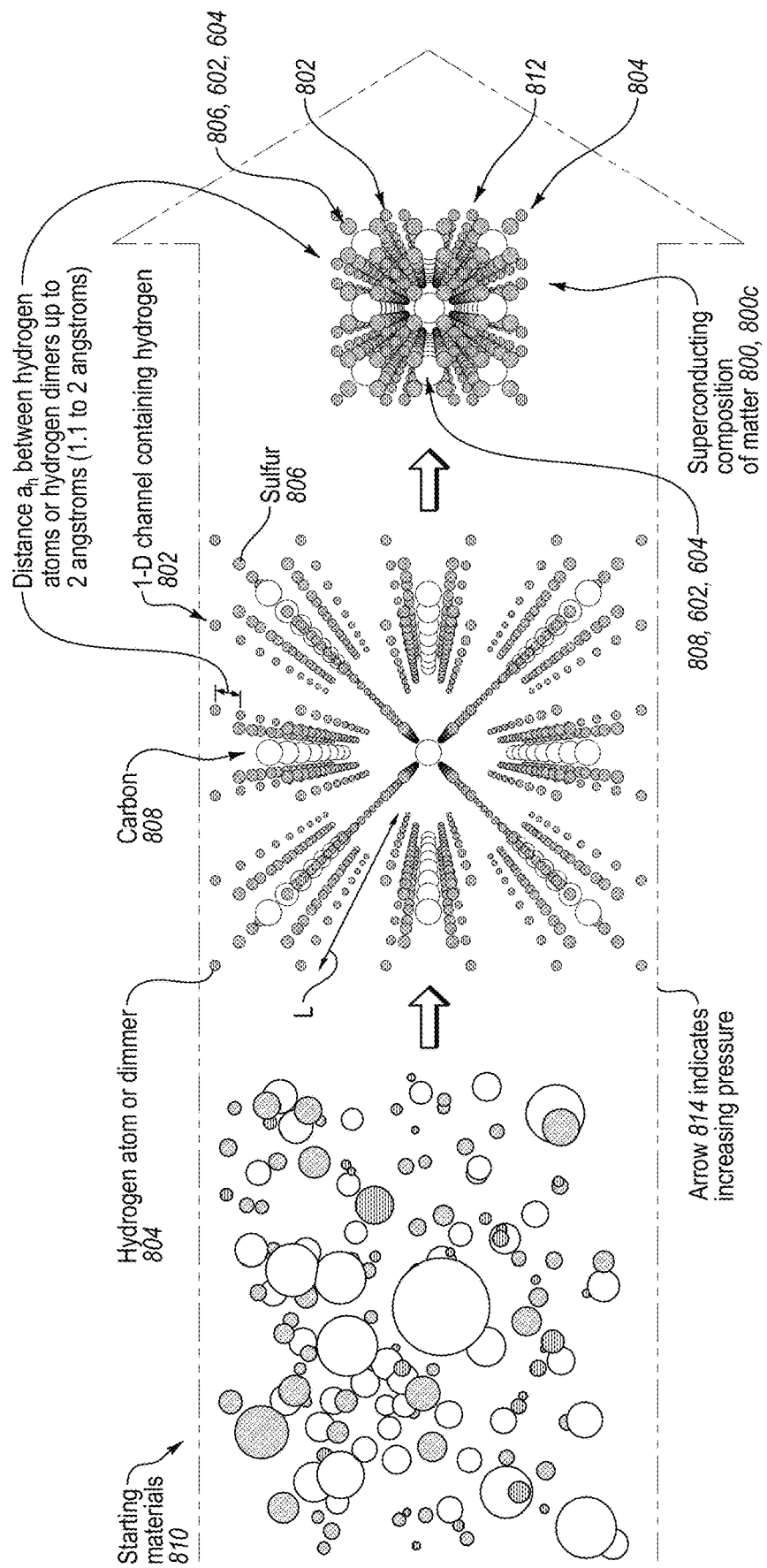
FIG. 8. Schematic showing formation of a superconductor structure including channels or a network including hydrogen.

FIG. 8 illustrates an example wherein the superconductor 800 comprises a composition of matter comprising a hydrogen network 812, hydrogen framework, or channels 802 or pores comprising hydrogen 804. The channels or pores (e.g., 1-dimensional pores or 1-dimensional channels) comprise a series of hydrogen atoms or hydrogen dimers (molecular hydrogen) positioned along a length L of the channels. In various examples, the distance $a_h$ between neighboring hydrogen atoms or dimers in the channel is in a range of 1.1 angstroms to 2 angstroms. In various examples, the channels or network comprise one or more fiber structures, one or more filament structures, or other structures (e.g., ribbons whose length is substantially (e.g., at least 1000 times) longer than their width.

The channels are defined by a surrounding lattice of chemical constituents (stabilizing agents 602 and/or pressurizing agents 604) distinct from the hydrogen network. In various examples, the lattice, framework, or matrix (e.g., comprising chemical constituents such as the stabilizing agents or pressurizing agents) contains or holds the hydrogen in the composition of matter and provides a chemical environment for the hydrogen allowing higher $T_c$ at lower pressures.

FIG. 8 illustrates an example wherein the stabilizing agent and/or pressurizing agent comprises chemical constituents including carbon and sulfur. However, other chemical constituents (e.g., stabilizing agents and pressurizing agents) can be used as illustrated herein. The arrow 814 indicates the direction of increasing pressure as the superconductor is formed from compression of starting materials 810.

Thus, FIG. 8 illustrates another example of a composition of matter, comprising a solid hydride 800c exhibiting superconductivity or comprising a superconductor at a temperature of at least 150 kelvin at an ambient pressure below 180 gigapascals, or at a temperature of at least 261 kelvin, wherein the solid hydride comprises a framework defining channels, each of the channels comprising a series of hydrogen atoms or hydrogen dimers 804 positioned along a length L of the each of the channels 802 and wherein the hydrogen atoms or hydrogen dimers 804 have a spacing an in the range 1.1 angstroms$\leq a_h \leq$2 angstroms, and wherein the spacing comprises the distance between the hydrogen in the dimers or between neighboring dimers or hydrogen atoms 804 in the each of the channels.

FIG. 8 illustrates a solid hydride 800 comprising at least 3 different elements including hydrogen and exhibiting superconductivity (e.g., at a temperature of at least 170 kelvin). However, the solid hydride may also comprising at least 4 or more different elements including hydrogen and exhibit superconductivity (e.g. at a temperature of at least 100 kelvin).

Example 8: Covalent Metal Hydrides

In one or more examples, the superconductors 600, 800 disclosed herein are covalent metal hydrides. Without being bound by scientific theory, a covalent metal hydride is defined as having a strongly covalent-bonding/antibonding states crossing the Fermi energy so that at least some components of the superconductor are covalently bonded. At high pressures, these covalent hydrogen-rich compounds have higher hydrogen content compared to nominal valences of the constituent elements of the superconductor. The non-hydrogen atoms in the superconductor are selected with the specific electronegativity needed to form a covalent metal hydride.

In various examples illustrated herein, the covalent metal hydride is formed by compression of a Van der Waals solid following molecular exchange between the molecules in the Van der Waals solid. Compression of the Van der Waals solid (Block 106, FIG. 1) reduces the inter-atomic and intra-molecular distances between the molecules so that the interatomic forces between molecules and the covalent bonds begin to become comparable and the system begins to establish covalent bonds between the molecules, forming a covalent metal hydride.

The degree of covalency (degree of overlapping of atomic orbitals or bond hybridization given by the exchange integral) and the formation of a covalent metal hydride can be determined or measured using a variety of methods, techniques, or tools including angle-resolved photoemission spectroscopy (ARPES), optical vibrational spectroscopy e.g. FTIR and Raman spectroscopy, resonant inelastic X-ray scattering (RIXS), and Density Functional Theory to calculate the partial-density of states.

A covalent metal hydride as described herein can be differentiated from a metal hydride or metal superhydride. Investigation of the predicted band structures of rare-earth (La and Y) super-hydrides implies an ionic heavy atom that donated its valence electrons into the hydrogen network, stabilizing a clathrate-like hydrogen cage structure. See, Strobel et al. (cited above) and also see, Liu, H., Naumov, I. I., Hoffmann, R., Ashcroft, N. W. & Hemley, R. J. Potential high-Tc superconducting lanthanum and yttrium hydrides at high pressure, *Proc. Natl. Acad. Sci. U.S.A* 114, 6990-6995 (2017). Based on the properties of metallic hydrogen, such metal hydride compounds have a high density of hydrogen related states at the Fermi level and a large electron-phonon coupling related to the hydrogens allowing formation of a superconductor. A corollary to the density of hydrogen-derived states at the Fermi level is that the hydrogen must take on forms other than molecular $H_2$ which populates energy states below the Fermi level. Thus, the hydrogen in the metal hydrides is in an atomic-like form, in contrast to the more molecular-type hydrogen bonding comprising shared electrons in a covalent metal hydride as described herein.

Example 9: Compositional Tuning

Chemical tuning (e.g., within a ternary or a quaternary system) provides a path to tailoring or tuning the chemical environment and composition to optimize or tailor the superconducting properties/quantum states and pressures applied during manufacturing and/or operation for various applications. Further "compositional tuning" of C—S—H—X ternary/quaternary systems through controlling molecular exchange at various pressures (including lower pressures) may be used to tailor the quantum states and achieve superconductors that are stable (or metastable) at ambient pressure and have higher or lower $T_c$ as needed for various applications.

Controlled tunability of pressure and temperature (i.e., the energy density) is critical in the search for new materials. This interplay between pressure and temperature provides a powerful tool—giving access to novel states, allowing control of reaction pathways, and directly examining kinetic factors.

Figure 9:
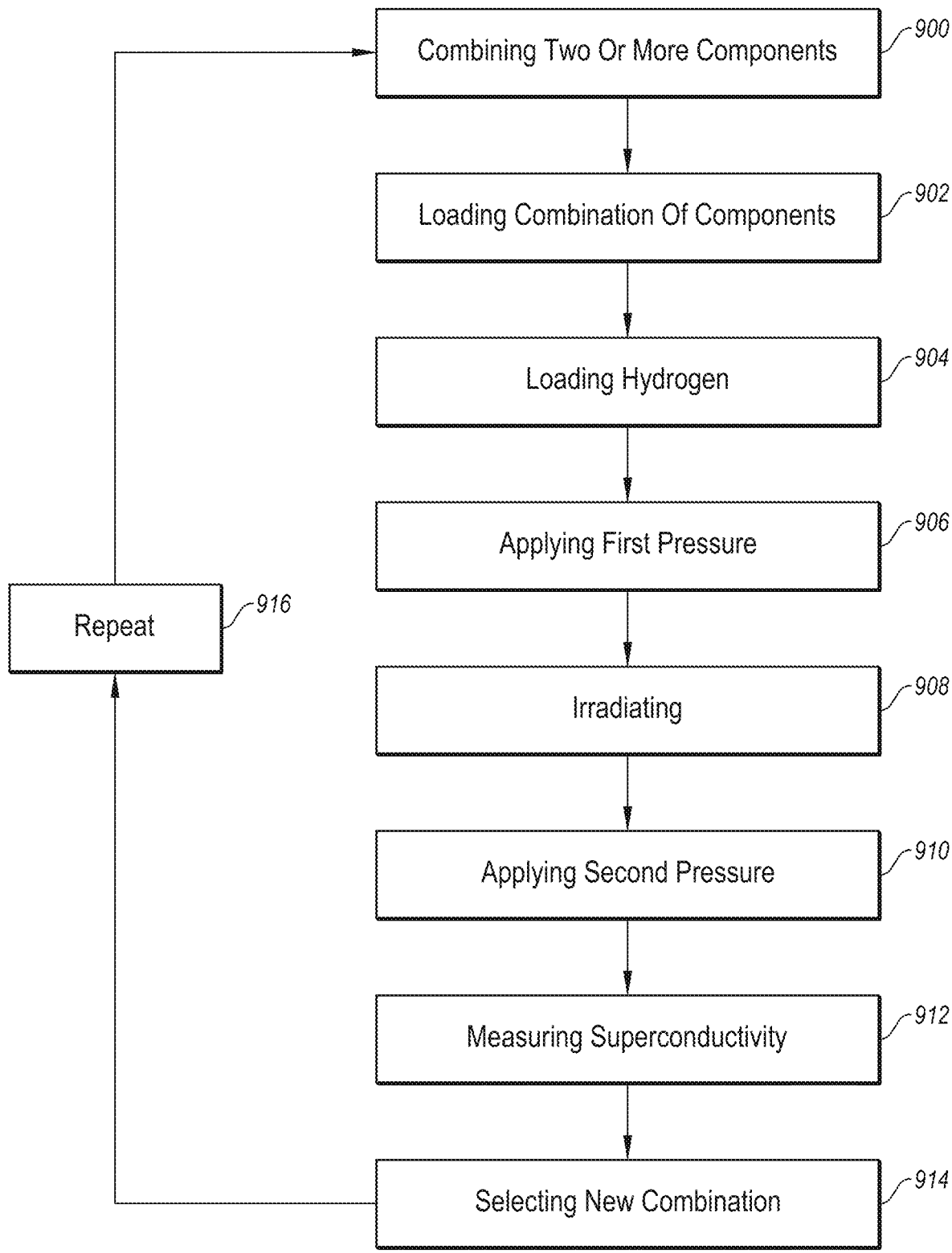
FIG. 9: Flowchart illustrating compositional tuning.

FIG. 9 is a flowchart illustrating a method of making a composition of matter using compositional tuning or chemical tuning to manufacture samples with different starting materials.

Block 900 represents combining two or more components comprising elements suitable for forming a host structure or framework for hydrogen, so as to form a combination of components. In one or more examples, the components are combined or mixed in molar ratios and milled (e.g., using ball milling) so as to form a powder mixture comprising (e.g., homogeneous) particles having a diameter smaller than 5 micrometers. In further examples, the components are mixed using metal sputtering techniques that deposit controlled mixtures of stoichiometric metal alloys (e.g. La+Y or Li+Mg). The components can also be mixed by gas loading of the components as molecular gaseous starting materials.

Block 902 represents loading the combination of the components (e.g., powder mixture) into a pressure device, e.g., as illustrated in FIG. 2.

Block 904 represents loading the hydrogen so as to contact the hydrogen with the combination of components (e.g., powder mixture). In some embodiments, all components (including hydrogen) are loaded and mixed as molecular gaseous starting materials. In one or more examples, hydrogen is cryogenically loaded or gas loaded at a pressure of several thousand bar.

Block 906 represents applying a first pressure to the hydrogen and the combination of starting materials/components using the pressure device.

Block 908 represents irradiating or heating the combination and the hydrogen with electromagnetic radiation or other heating means while applying the first pressure. In one or more examples, the first pressure and the irradiating or heating provide conditions initiating a reaction form one or more chemical bonds between the hydrogen and at least one of the elements, forming molecules each comprising a hydrogen moiety combined with one of the elements.

In one or more examples, the molecules form an intermediate product comprising a Van der Waals solid. In one or more examples, the irradiating and the first pressure provide conditions enabling molecular exchange between the plurality of molecules and increase a coordination number of one or more of the elements to at least 6 (e.g., in a range of 6-20).

Example pressures are in a range of 0.1 to 20 GPa (gigapascals).

In some examples, the components and hydrogen are combined to form one or more intermediate products using photochemical synthesis comprising the irradiating with visible electromagnetic radiation providing photon energy for chemical bond formation rather than thermal energy.

In other examples, the intermediate products are formed using thermal synthesis using ohmic heating or laser heating from a continuous wave (CW) or pulsed source.

Block 910 represents compressing the molecules at a second pressure to form a solid compound.

Block 912 represents measuring one or more properties of the solid so as to determine whether the solid is a superconductor.

Block 914 represents selecting the two or more elements from a list of suitable elements and repeating steps of Blocks 900-912 for every combination of the two or more elements in the list. In one or more examples, the elements are independently selected from Li, B, Be, Mg, Mn, Fe, Sc, N, Se, P, Y, C, or La from the periodic table of the elements. The step further comprises selecting the combination exhibiting superconductive properties at the lowest second pressure.

Block 916 represents repeating steps of Blocks 900-912 with the selected combination; and varying, in turn, conditions including at least one of the first pressure, the wavelength of the electromagnetic radiation, the intensity of the electromagnetic radiation, the duration of the irradiation, and relative amounts of each component/element, so as to identify the conditions and components or compositions achieving the superconductivity and stability at the lowest second pressure and without application of the second pressure or with the reduced second pressure.

In one or more examples, the superconductor comprises a solid hydride including a first component A comprising a hydrogen-containing component including the hydrogen; a second component B and a third component C; and the solid hydride has the formula $A_a B_b C_c H_x$; wherein C is H in a ternary compound and C is different from H in a quaternary compound, b:c is in a range of 1:20 to 20:1., a:b is in a range of 1:20 to 20:1, x is in a range from 1 to 15, and A, B, or C are independently selected from Li, B, Be, Mg, Mn, Fe, Sc, N, Se, P, Y, C, S, or La. A, B, or C can be substituted with other elements from the list or other elements to reflect doping (e.g., doping with other elements up to 20%).

In one or more examples, the superconductor formed by the method of FIG. 9 comprises the structure of any of the examples 1-40 in the next section entitled "composition embodiments." In one or more examples, the superconductor has at least a picoliter volume or has a diameter of at least 0.1 mm diameter and a thickness of at least 0.05 mm.

In the step represented by block 908, example intermediate products formed include, but are not limited to:

S+C+H2

H2S+CH4+H2+X

H2S+CH4+X

H2S+C+S+X(H2S+CH4+X)

H2S+C+NH3

H2S+C+NH3+X

CS2+H$_2$

Li2XH16 where X=Li, B, Be, Mg, Mn, Fe, Sc, N, Se, P, Y, or La.

The justification for selecting N, Se, P is the availability of lone pairs for donating into the sigma bonds of H$_2$ to drive bond dissociation (a lower of the bond order).

The justification for selecting Li, B, Be is the addition of lighter atoms to the system to assist with electron phonon coupling mechanisms and phono-mediated superconductivity.

The justification for selecting Mg, Mn, Fe, Sc, Y, La is that their presence in these ternary/quaternary is most likely non-stoichiometric but may be necessary to permit a greater amount of hydrogen intercalated into the solid framework at low pressures.

ADDITIONAL EMBODIMENTS

A. Composition of Matter Additional Embodiments

Examples of superconductive hydrides include, but are not limited to, the following. The superconducting compositions of matter can be manufactured using the method of FIG. 1 or FIG. 9 (referring to FIGS. 1-9).

A1. FIGS. 6-8 illustrate a composition of matter, comprising: a solid hydride 600, 800 exhibiting superconductivity or comprising a superconductor: at a temperature of at least 150 kelvin at an ambient pressure below 180 gigapascals, or at a temperature of at least 261 kelvin.

A2. The composition of matter of example A1, wherein the solid hydride includes a first amount of hydrogen, a second amount of a material (e.g., selected from sulfur (S), lithium (Li), boron (B), beryllium (Be), magnesium (Mg), manganese (Mn), iron (Fe), scandium (Sc), nitrogen (N), selenium (Se), phosphorus (P), yttrium (Y), carbon (C), or lanthanum (La)), and the first amount, the second amount, and the composition of the material are such that, or are tuned or tailored such that, the solid hydride exhibits the superconductivity, is superconductive, has superconductive properties, or comprises the superconductor: at the temperature of at least 150 kelvin at an ambient pressure below 180 gigapascals, or at a temperature of at least 261 kelvin.

A3. The composition of matter of examples A1 or A2, wherein the ambient pressure comprises a pressure applied by a gaseous and/or liquid atmosphere in physical contact with or surrounding the solid hydride.

A4. The composition of matter of any of the examples A1-A3, wherein the solid hydride exhibits the superconductivity at the temperature of at least 160 kelvin, at least 170 kelvin, at least 180 kelvin, at least 200 kelvin, at least 277 kelvin, or at least 280 K.

A5. The composition of matter of any of the examples A1-A4, wherein the superconductivity is at the temperature in a range up to 500 kelvin (e.g., at the temperature in a range of 160 kelvin-500 kelvin).

A6. The composition of matter of any of examples A1-A5, wherein the solid hydride comprises at least two chemical elements selected from sulfur (S), lithium (Li), boron (B), beryllium (Be), magnesium (Mg), manganese (Mn), iron (Fe), scandium (Sc), nitrogen (N), selenium (Se), phosphorus (P), yttrium (Y), carbon (C), or lanthanum (La).

A7. A composition of matter, comprising: FIGS. 6 and 8 illustrate a solid hydride 600, 800 comprising at least 3 different elements including hydrogen and exhibiting superconductivity at a temperature of at least 170 kelvin.

A8. FIG. 7 illustrates the composition of matter of any of the examples A1-A6, wherein: the solid hydride is formed from a combination of $XH_x + YH_y + H_2$, where X=Li, B, Be, Mg, Mn, Fe, Sc, N, Se, P, Y, C, S, La, Y=Li, B, Be, Mg, Mn, Fe, Sc, N, Se, P, Y, C, S, La, and x and y are the stoichiometric amounts of the compounds comprising X and Y respectively.

A9. A composition of matter, comprising: a solid hydride comprising at least four different elements including hydrogen and exhibiting superconductivity at a temperature of at least 100 kelvin.

A10. The composition of matter of any of the examples A1-A6 or A9, wherein: the solid hydride is formed from a combination of $XH_x+YHy+ZHz+H_2$, where X=Li, B, Be, Mg, Mn, Fe, Sc, N, Se, P, Y, C, S, La, Y=Li, B, Be, Mg, Mn, Fe, Sc, N, Se, P, Y, C, S, La, and Z=Li, B, Be, Mg, Mn, Fe, Sc, N, Se, P, Y, C, S, La, and x, y, and z are the stoichiometric amounts of the compounds comprising X, Y, and Z, respectively.

A11. The composition of matter of any of the preceding examples, wherein: the solid hydride comprises a first component A comprising a hydrogen-containing component comprising the hydrogen; a second component B and a third component C; and the solid hydride has the formula $A_aB_bC_cH_x$; and wherein b:c is in a range of 1:20 to 20:1, a:b is in a range of 1:20 to 20:1; x is in a range from 1 to 15; H is hydrogen; C can be H with x=0 in a ternary system and C is different from H in a quaternary system; and one or more of A, B, C are undoped or comprise a dopant concentration in a range 0-20%.

A12. The composition of matter of example A11, wherein A comprises carbon and B comprises sulfur.

A13. The composition of matter of example A11, wherein A, B, and/or C comprise at least one element selected from Li, Y and La.

A14. The composition of matter of example A11, wherein: A comprises at least one element selected from Li, B, Be, Mg, Mn, Fe, Sc, N, Se, P, Y, C, S, and La, and B comprises at least one element selected from Li, B, Be, Mg, Mn, Fe, Sc, N, Se, P, Y, C, S, La.

A15. The composition of matter of any of the preceding examples A1-A14, wherein the solid hydride comprises a metallic crystal comprising a metal or carbon, sulfur, and hydrogen.

A16. FIGS. 2-5, 6, and 7 illustrate the composition of matter of any of the preceding examples A1-A15, wherein the solid hydride 600, 700 has the formula $(H_2S)_{2-x}(CH_4)_xH_2$, or is formed from compression of an intermediate product having the formula $(H_2S)_{2-x}(CH_4)_xH_2$, or XHx is methane and YHy is $H_2S$.

A17. The composition of matter of any of the examples A1-A15, wherein the solid hydride comprises a component (e.g., A, B, C, X, Y, Z) covalently bonded to hydrogen and having a coordination number of at least 6 (e.g., in a range of 6-20).

A18. FIG. 8 illustrates the composition of matter of any of the preceding examples A1-A16, wherein: the solid hydride comprises a framework defining one or more channels, each of the channels comprising or containing a series of hydrogen atoms or hydrogen dimers positioned along a length of the each of the channels.

A19. FIGS. 6 and 8 illustrate the composition of matter of example A18, wherein the solid hydride comprises the hydrogen atoms or hydrogen dimers having an (e.g., interatomic) spacing an in a range 1.1 angstroms≤$a_h$≤1.3 angstroms or in a range 1.1 angstroms≤$a_h$≤2 angstroms wherein the spacing is between the hydrogen atoms in the dimer or between neighboring or adjacent hydrogen atoms in the series of hydrogen atoms along the length of the channel.

A20. FIG. 7 illustrates the composition of matter of any of the preceding examples A1-A19, wherein the solid hydride has a structure formed from compression of a Van der Waals solid.

A21. FIG. 7 illustrates the composition of matter of example A20, wherein the Van der Waals solid precursor comprises hydrogen in the form $H_2$, a first molecule (e.g., XHx) comprising a first hydrogen moiety, and a second molecule (e.g., YHy) comprising a second hydrogen moiety.

A22. The composition of matter of examples A20 or A21, wherein solid hydride has a structure formed using molecular exchange between the molecules (e.g, XHx. YHy) or different components of the Van der Waals solid.

A23. The composition of matter of any of the preceding examples A1-A22, wherein the solid hydride or an intermediate product compressed to form the solid hydride comprises at least one of methane, molecular hydrogen, a hydrogen polymer, or a multi-valent hydride, HS, silane, or LiH, or other hydrogen-containing compound derived from a hydrogen precursor.

A24. The composition of matter of any of the preceding examples A21-23, wherein the solid hydride comprises a covalent metal hydride.

A25. The composition of matter of any of the preceding examples A1-A24 wherein the solid hydride comprises a polymer, an organic compound (e.g., a hydrocarbon), or an organically derived compound comprising the structure of the organic compound wherein carbon is substituted with an element different from carbon.

A26. FIG. 6, FIG. 7, and FIG. 8 illustrate a composition of matter, comprising: a superconductor 600, 800 comprising a solid formed from compression of a guest-host structure 700 comprising a host structure 702 and a guest structure 704, wherein: at least one of the host structure 702 or the guest structure 704 comprises a periodic lattice 708, the guest structure includes hydrogen (or a hydrogen containing component, e.g., $H_2$), and the host structure comprises at least one of: means for stabilizing (a stabilizing agent 602) promoting bonding of the hydrogen to the host structure and/or formation of a distinct network 802 comprising at least some of the hydrogen; or means for pressurizing (a pressurizing agent 604) applying chemical pressure to the periodic lattice so as to reduce inter-atomic spacing in the lattice; and such that the superconductor exhibits superconductivity or is the superconductor at a temperature of at least 100 kelvin and at an ambient pressure or environmental pressure below 300 gigapascals. In one or more examples, the ambient pressure comprises a pressure applied by a gaseous and/or liquid atmosphere in physical contact with or surrounding the solid hydride superconductor.

A27. The composition of matter of example A26, wherein: the stabilizing agent 602 comprises at least one of C, Li, B, Be, Mg, Mn, Fe, Sc, N, Se, P, Y, or La, the pressurizing agent 604 comprises at least one of S, Li, B, Be, Mg, Mn, Fe, Sc, Se, P, Y, or La, and further comprising a hydrogen-containing component comprising atomic hydrogen, molecular hydrogen, a hydrogen polymer, or a multivalent hydride.

A28. The composition of matter of example A26, wherein the hydrogen-containing component is methane, HS, H2S, Silane, or LiH.

A29. The composition of matter of any of the examples A26-A28, wherein the stabilizing agent has a coordination number of at least 6 (e.g., in a range of 6-20).

A30. The composition of matter of any of the examples A26-A29, wherein the superconductor has a hydrogen content that is higher compared to a largest content possible as determined by formal oxidation states of constituent elements of the solid at ambient conditions (e.g., atmospheric pressure and room temperature) prior to a compression of the constituent elements comprising the stabilizing agent and the pressurizing agent.

A31. The composition of matter of any of the preceding examples A26-A30, wherein the solid or the guest-host structure 700 has the formula $(H_2S)_{2-x}(CH_4)_xH_2$.

A32. The composition of matter of example A31, wherein the host structure comprises a hydrogen-hydrogen sulfide structure where HS or $H_2S$ has been substituted for methane.

A33. The composition of matter of any of the examples A26-A32, wherein the guest-host structure comprises a Van der Waals solid and compression transforms interactions from non-covalent interactions with the hydrogen-containing component (e.g., $H_2$) to a system wherein at least one of a first bond between the hydrogen-containing component and the stabilizing agent, or between the pressurizing agent and the hydrogen containing component has an increased degree of covalency or is a covalent bond.

A34. The composition of matter of any of the examples A26-A33 comprising the solid hydride of any of any of the examples A1-A25.

A35. FIG. 8 illustrates a composition of matter, comprising: a superconductor 800 or superconducting composition of matter comprising covalent metal hydride having at least 2 different chemical elements and hydrogen atoms or hydrogen dimers, wherein a (e.g., inter-atomic) distance $a_h$ between the hydrogen atoms or the hydrogen dimers is in a range of 1.1 angstroms$\leq a_h \leq$1.3 angstroms or in a range 1.1 angstroms$\leq a_h \leq$2 angstroms.

A36. FIG. 6 and FIG. 8 illustrate a composition of matter, comprising: a hydride 600, 800 exhibiting superconductivity at a temperature of at least 250 kelvin formed from a compression of a Van der Waals solid.

A37. FIG. 6 and FIG. 7 illustrate A composition of matter 600, 800 comprising a superconductor formed from molecular exchange between a plurality of molecules (e.g., XHx, YHy) disposed in a lattice 708, wherein the superconductor exhibits superconductivity at a temperature of at least 250 kelvin.

A38. The composition of matter of any of the examples A34-A37, including the solid hydride of any of the examples A1-A24 or A25.

A39. The composition of matter of any of the preceding examples A1-A38, wherein the hydride has a hydrogen content (or means for providing the hydrogen content) that is higher compared to a largest content possible as determined by formal oxidation states of constituent elements of the hydride, solid hydride, or the superconductor at ambient conditions (e.g., atmospheric pressure and room temperature) prior to a compression of the constituent elements.

A40. The composition of matter of any of the preceding examples A1-A38, comprising means for holding hydrogen in a framework and/or providing the hydride having the superconductive properties as described herein.

A41. The composition of matter of any of the preceding examples, wherein the superconductivity is characterized by the hydride, the solid hydride, or the superconductor having or exhibiting at least one of zero electrical resistance, a critical magnetic field, an expulsion of an external magnetic field according the Meissner effect, and/or a diamagnetic property. In one or more examples, the electrical resistance measured above zero comprises noise but the hydride or solid hydride is considered a superconductor having no (or zero) electrical resistance.

A42. A device (e.g., useful in quantum computing, a power electronics, or transportation) comprising the superconductor or composition of matter of any of the examples A1-A40.

B. Method and Apparatus Additional Embodiments

The present disclosure describes methods and devices for making a composition of matter. Example methods include, but are not limited to, the following.

B1. A method of making a composition of matter, comprising: (a) providing one or more first conditions that initiate a reaction between two or more different materials and hydrogen so as to form a plurality of molecules each comprising a hydrogen moiety and at least one constituent element from a different one of the different materials; and (b) providing one or more second conditions that tune an intra-atomic and intermolecular distance of the plurality of molecules so as to form a solid compound comprising a superconductor comprising the constituent elements and the hydrogen and wherein: the superconductor exhibits superconductivity at a temperature above 170 kelvin, and/or the different materials each comprise the at least one constituent element selected from S, Li, B, Be, Mg, Mn, Fe, Sc, N, Se, P, Y, C, and La.

B2. The method of example B1, wherein the first conditions comprise a first pressure and irradiation using electromagnetic radiation.

B3. The method of example B2, wherein at least one of the different materials comprises sulfur and the irradiating causes photoscission of the at least one of the different materials into the constituent elements comprising sulfur so as to allow formation of a bond between the sulfur and the hydrogen moiety in at least one of the molecules.

B4. The method of any of examples B1-B3, wherein the second conditions include a second pressure.

B5. The method of example B4, wherein the second pressure includes chemical pressure applied by at least one of the chemical constituents.

B6. The method of any of the examples B1-B5, wherein the second conditions form the superconductor comprising hydrogen atoms or hydrogen dimers separated by a distance $a_h$ in a range of 1.1$\leq a \leq$2 angstroms.

B7. The method of any of the preceding examples B1-B6, wherein the first conditions include: irradiating with electromagnetic radiation having an intensity greater than 10 milliwatts for at least 2 hours, and a first pressure in a range of 3-5 gigapascals or so that hydrogen is not solidified.

B8. The method of any of the preceding examples B1-B7, wherein the first conditions form the plurality of molecules into at least one of a Van der Waals solid or a lattice comprising a guest-host structure.

B9. The method of any of examples B1-B8, wherein the irradiating and the pressure provide the first conditions enabling molecular exchange between the plurality of molecules and/or increase a coordination number of one or more of the constituent elements of the molecules to at least 6.

B10. The method of any of examples B1-B9, wherein the different materials comprise a powder comprising particles having a diameter of 10 microns or less.

B11. The method of any of examples B1-B10, further comprising selecting three or more of the different materials so as to form the superconductor comprising at least three of the constituent elements.

B12. The method of any of examples B1-B11, further comprising providing the hydrogen as a hydrogen precursor comprising atomic hydrogen, molecular hydrogen, a hydrogen polymer, or a multi-valent hydride.

B13. The method of example B12, wherein the hydrogen precursor is methane, HS, Silane, LiH, or any hydrogen precursor used in molecular beam epitaxy or chemical vapor deposition.

B14. A superconducting composition of matter manufactured according to the method of any of the preceding examples B1-B13.

B15. An apparatus for making a superconductor, comprising: a pressure device for applying pressure up to at least 400 gigapascals; and a laser coupled to the pressure device, wherein: the laser outputs electromagnetic radiation having a wavelength and intensity configurable to initiate, in combination with a first pressure applied using the pressure device, a reaction between two or more different materials and hydrogen so as to form a plurality of molecules each comprising a hydrogen moiety and at least one constituent element from a different one of the different materials; and the pressure device applies a second pressure that tunes an intra-atomic and intermolecular distance of the plurality of molecules so as to form a solid compound comprising a superconductor comprising the constituent elements and the hydrogen and wherein: the superconductor exhibits superconductivity at a temperature above 170 kelvin, and/or the different materials each comprise the at least one constituent element selected from S, Li, B, Be, Mg, Mn, Fe, Sc, N, Se, P, Y, C, and La.

B16. The apparatus of example B15, wherein the laser is configured to output the electromagnetic radiation causing photoscission of the at least one of the different materials into the constituent elements comprising sulfur so as to allow formation of a bond between the sulfur and the hydrogen moiety in at least one of the molecules.

B17. The apparatus of examples B15 or B16, wherein: the pressure device comprises a diamond anvil including two diamond pieces and a gasket comprising a sample holder, wherein the gasket is at an interface between the two diamond pieces; and the laser is coupled to the pressure device so as to transmit the electromagnetic radiation through one of the diamond pieces to the sample holder.

B18. A method of making a composition of matter, comprising: (a) combining two or more components comprising constituent elements suitable for forming a host structure for hydrogen; (b) loading the hydrogen and the two or more components into a pressure device so as to contact the hydrogen with the two or more components; (c) applying a first pressure to the hydrogen and the components in the pressure device; (d) irradiating the components and the hydrogen with electromagnetic radiation, wherein the first pressure and the irradiation initiate a reaction between the components and hydrogen so as to form a plurality of molecules each comprising a hydrogen moiety and at least one constituent element from a different one of the components; (e) compressing the molecules at a second pressure to form a solid compound; (f) measuring one or more properties of the solid compound so as to determine whether the solid compound is a superconductor; (g) selecting the two or more components from a list of components and repeating steps (a)-(f) for every combination of the two or more components in the list; and (h) selecting the combination of the two or more components forming the solid compound exhibiting superconductive properties at the lowest second pressure, to obtain a "selected combination"; (i) repeating steps (a)-(f) with the selected combination, varying, in turn, conditions including at least one of the first pressure, the wavelength of the electromagnetic radiation, the intensity of the electromagnetic radiation, the duration of the irradiation, and amount of each of the constituent elements, so as to identify the conditions achieving the superconductivity and stability of the solid compound at the lowest second pressure or without application of the second pressure comprising an ambient pressure.

B19. The method of example B18, wherein the list of components comprise the components comprising the constituent elements selected from Li, B, Be, Mg, Mn, Fe, Sc, N, Se, P, Y, C, and La.

B20. The method of any of examples B18-B19, wherein the step (d) forms a Van der Waals solid comprising the molecules.

B21. The method of any of examples B18-B20, wherein the irradiating and the first pressure in step (d) enable molecular exchange between the plurality of molecules and/or increase a coordination number of one or more of the constituent elements of the molecules to at least 6.

B22. The method of any of the examples B18-B21, wherein the components comprise a powder comprising particles having a diameter of 10 microns or less.

B23. The method of any of the preceding examples B18-B22, further comprising selecting three or more of the components so as to form the solid compound comprising at least three of the constituent elements.

B24. A superconducting composition of matter manufactured using compositional or chemical tuning comprising the method of any of the examples B18-B23.

B25. A method of making a composition of matter, comprising: compressing molecules so as to form a superconducting composition of matter comprising at least two different chemical elements and hydrogen wherein an interatomic distance a between the hydrogen comprising hydrogen atoms or hydrogen dimers is in a range of $1.1 \leq a \leq 2$ angstroms.

B26. The method or apparatus of any of the examples B1-B25, wherein the superconductor or superconducting composition of matter exhibits superconductivity at a temperature of at least 150 kelvin and at an ambient pressure below 180 gigapascals. In one or more examples, ambient pressure comprises a pressure applied by a gaseous and/or liquid atmosphere in physical contact with or surrounding the solid hydride.

B27. A composition of matter according to examples A1-A40 manufactured according to the method or apparatus of any of the examples B1-B26.

Further information on one or more embodiments of the present invention can be found in the following publication (and online additional information): Snider, Elliot, Dasenbrock-Gammon, Nathan, McBride, Raymond, Debessai, Mathew, Vindana, Hiranya, Vencatasamy, Lawter, Kevin V., Salamat Superconductivity in a Carbonaceous Sulfur Hydride, Nature, 586, 373-377 (14 Oct. 2020) and online additional information available at: doi.org/10.1038/s41586-020-2801-z. To the extent permitted in relevant jurisdictions, this article, and the associate additional information available online, is hereby incorporated by reference in its entirety.

The foregoing description of one or more embodiments of the invention has been presented for the purposes of illustration and description. It is not intended to be exhaustive or to limit the invention to the precise form disclosed. Many modifications and variations are possible in light of the above teachings. It is intended that the scope of the invention be limited not by this detailed description, but rather by the claims appended hereto.

What is claimed is:

1. A composition of matter, comprising:
a superconductor comprising a solid formed from compression of a guest-host structure comprising a host structure and a guest structure, wherein:
the solid or the guest-host structure has the formula $(H_2S)(CH_4)H_2$;
at least one of the host structure or the guest structure comprises a periodic lattice;
the guest structure includes hydrogen;
the host structure comprises:
 a stabilizing agent promoting bonding of the hydrogen to the host structure and/or formation of a distinct network comprising at least some of the hydrogen, the stabilizing agent comprising at least one of C, Li, B, Be, Mg, Mn, Fe, Sc, N, Se, P, Y, and La; and
 a pressurizing agent applying chemical pressure to the periodic lattice so as to reduce inter-atomic spacing in the periodic lattice, the pressurizing agent comprising at least one of S, Li, B, Be, Mg, Mn, Fe, Sc, Se, P, Y, and La; and
the superconductor exhibits superconductivity or is the superconductor at a temperature of at least 100 kelvin and at an ambient pressure below 300 gigapascals.

2. The composition of matter of claim 1, wherein:
the composition of matter comprises a hydrogen-containing component comprising atomic hydrogen, molecular hydrogen, a hydrogen polymer, or a multi-valent hydride.

3. The composition of matter of claim 2, wherein the hydrogen-containing component is methane, HS, $H_2S$, Silane, or LiH.

4. The composition of matter of claim 2, wherein the stabilizing agent has a coordination number of at least 6.

5. The composition of matter of claim 2, wherein the superconductor has a hydrogen content that is higher compared to a largest content possible as determined by formal oxidation states of constituent elements of the solid at ambient conditions prior to a compression of the constituent elements comprising the stabilizing agent and the pressurizing agent.

6. The composition of matter of claim 1, wherein the host structure comprises a hydrogen-hydrogen sulfide structure where HS or $H_2S$ has been substituted for methane.

* * * * *